(12) United States Patent
Tanaka

(10) Patent No.: US 6,849,825 B2
(45) Date of Patent: Feb. 1, 2005

(54) LASER IRRADIATION APPARATUS

(75) Inventor: Koichiro Tanaka, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 2 days.

(21) Appl. No.: 10/305,420

(22) Filed: Nov. 27, 2002

(65) Prior Publication Data

US 2003/0168437 A1 Sep. 11, 2003

(30) Foreign Application Priority Data

Nov. 30, 2001 (JP) ........................................ 2001-366271

(51) Int. Cl.$^7$ .......................... B23K 26/00; B23K 26/06
(52) U.S. Cl. .............................. 219/121.82; 219/121.6; 219/121.75
(58) Field of Search .................... 219/121.82, 121.6, 219/121.75, 121.78, 121.79, 121.8, 121.81, 121.83

(56) References Cited

U.S. PATENT DOCUMENTS

| | | | |
|---|---|---|---|
| 4,370,175 A | 1/1983 | Levatter | |
| 6,160,827 A | 12/2000 | Tanaka | |
| 6,172,330 B1 * | 1/2001 | Yamamoto et al. | 219/121.7 |
| 6,353,203 B1 * | 3/2002 | Hokodate et al. | 219/121.67 |
| 6,660,609 B2 | 12/2003 | Tanaka et al. | |
| 2002/0094008 A1 | 7/2002 | Tanaka | |
| 2003/0021307 A1 | 1/2003 | Yamazaki | |
| 2003/0035219 A1 | 2/2003 | Tanaka | |
| 2003/0038122 A1 | 2/2003 | Yamazaki et al. | |
| 2003/0080100 A1 | 5/2003 | Yamazaki et al. | |
| 2003/0089690 A1 | 5/2003 | Yamazaki et al. | |
| 2003/0143337 A1 | 7/2003 | Tanaka | |

OTHER PUBLICATIONS

Specification, claims, abstract and drawings of U.S. Appl. No. 10/252,828 entitled *Laser Irradiation Method and Laser Irradiation Device and Method of Manufacturing Semiconductor Device* filed Sep. 24, 2002.

Specification, claims, abstract and drawings of U.S. Appl. No. 10/207,769 entitled *Laser Irradiating Device, Laser Irradiating Method and Manufacturing Method of Semiconductor Device* filed Jul. 31, 2002.

* cited by examiner

Primary Examiner—Samuel M. Heinrich
(74) Attorney, Agent, or Firm—Eric J. Robinson; Robinson Intellectual Property Law Office, P.C.

(57) ABSTRACT

A footprint (an area on a plane necessary for processing) of a laser irradiation apparatus for moving a stage supporting thereon a substrate in X and Y direction becomes unavoidably large when the substrate becomes greater in size, and the apparatus becomes very great as a whole. In a laser irradiation apparatus of the invention, a galvanomirror or a polygon mirror irradiates and scans a laser beam to and on a semiconductor film and always keeps an angle θ of incidence of the laser beam to the semiconductor film at a certain angle.

42 Claims, 14 Drawing Sheets

Fig.3A1
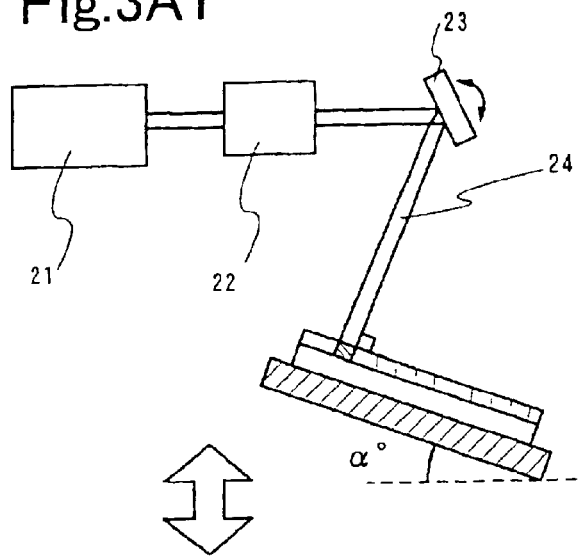
Fig.3A2
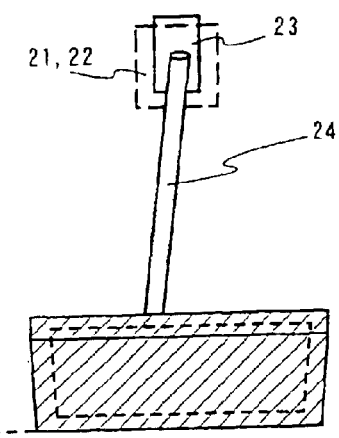
Fig.3B1
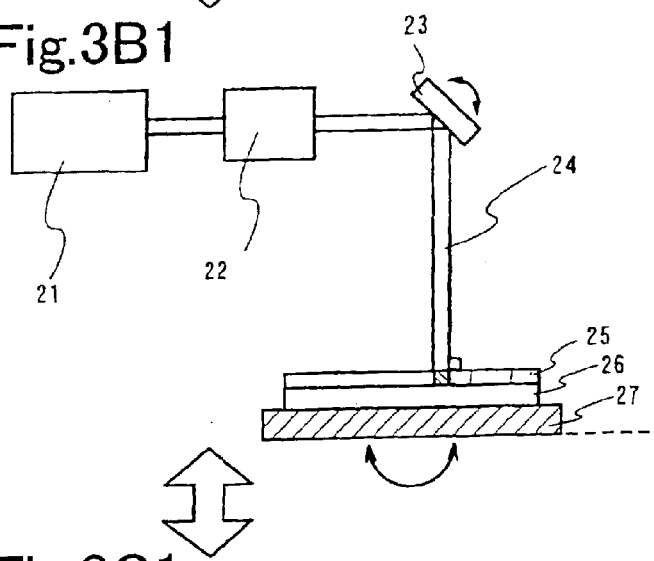
Fig.3B2
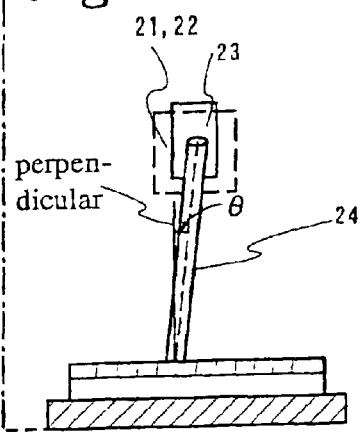
Fig.3C1
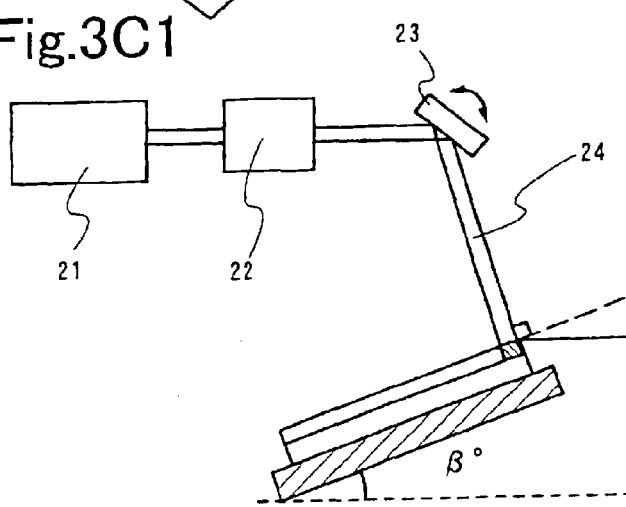
Fig.3C2
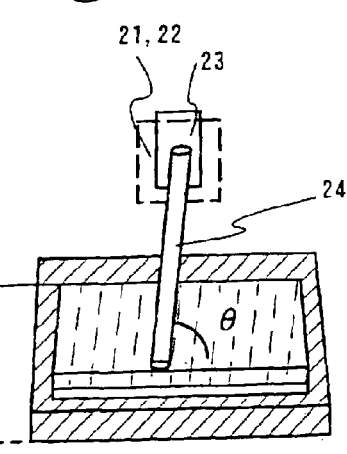

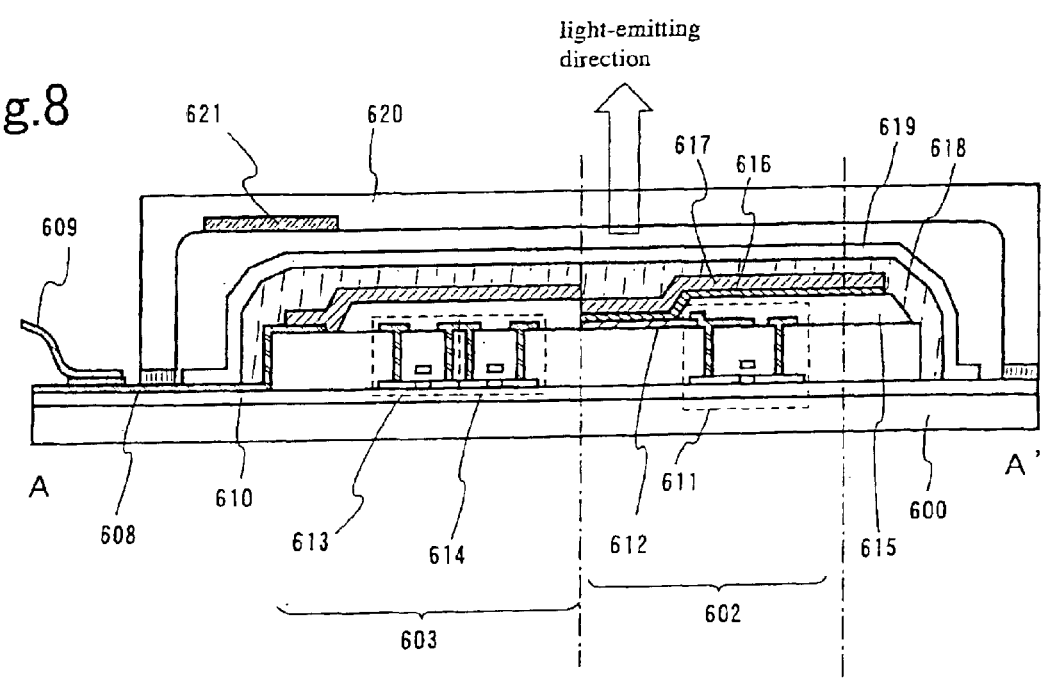

LASER IRRADIATION APPARATUS

BACKGROUND OF THE INVENTION

1. Field of the Invention

This invention relates to a method of annealing a semiconductor film by using a laser beam (hereinafter called "laser annealing") and a laser irradiation apparatus (an apparatus including laser and an optical system for guiding a laser beam outputted from the laser to a treated object) for executing the method. The invention relates also to a fabrication method of a semiconductor device that includes a laser annealing step.

The term "semiconductor device" used in this specification designates all those devices that operate by utilizing semiconductor characteristics, and electro-optical apparatuses, light-emitting apparatuses, semiconductor circuits and electronic appliances are all semiconductor devices.

2. Description of the Related Art

A technology of forming thin film transistors (TFT) by using a semiconductor film (having thickness of several to hundreds of nm) formed on a substrate having an insulating surface has drawn an increasing attention in recent years. The thin film transistors have widely been applied to electronic devices such as IC and electro-optical apparatuses, and development as a switching device of an image display apparatus has been hastened, in particular.

A technology that applies laser annealing to a semiconductor film formed on an insulating substrate such as glass to crystallize the semiconductor film or to improve its crystallinity has extensively been studied. The semiconductor film uses silicon in most cases. In this specification, means for crystallizing the semiconductor film by using the laser beam and acquiring a semiconductor film having a crystalline structure will be referred to as "laser crystallization".

In comparison with a synthetic quartz glass substrate that has widely been used in the past, a glass substrate is more economical, has higher workability and has the advantage that a substrate having a large area can be easily produced. This is the reason why the studies have been made. The reason why laser is preferably used for crystallization is because the melting point of the glass substrate is low. Laser can impart high energy to only the semiconductor film without much raising the temperature of the substrate. Through-put is by far higher than that of heating means using an electric heating furnace.

Because semiconductors having a crystalline structure contain a large number of crystal grains, they are called also "poly-crystalline semiconductor films". The semiconductor film having the crystalline structure and formed by the application of laser annealing has high mobility. When a thin film transistor (TFT) is fabricated by use of this crystalline semiconductor film, TFT for a pixel portion and TFT for a driving circuit can be formed on one glass substrate.

When a laser beam is irradiated to the semiconductor film formed on the substrate in a scanning method of a laser beam such as laser crystallization, a laser beam shaped into a belt shape is irradiated in a longitudinal direction (Y direction) of the substrate, and the irradiated region is moved in a transverse direction (X direction) relative to the substrate so as to scan the laser beam. Laser irradiation apparatuses according to the prior art mostly employ a system in which a stage supporting thereon a substrate is moved in the X direction (or the Y direction) relative to a fixed laser beam region to scan the laser beam.

When the size of the substrate becomes great in the laser irradiation apparatus for moving the stage having the substrate supported thereon in the X and Y directions, however, a footprint (an area on a plane necessary for processing) becomes drastically great in proportion to the increase of the substrate size, and the apparatus becomes very great in size as a whole.

Sizes of 590 mm×670 mm, 600 mm×720 mm and 650 mm×830 mm have been used at present on production lines as the size of large glass substrates, and sizes of 680 mm×880 mm, 730 mm×920 mm or sizes exceeding them will be presumably used in future.

When a spot beam is used in the laser irradiation apparatus that moves the stage in the X and Y directions, at least a space corresponding to two substrate sizes in the X direction and a space corresponding to two substrate sizes in the Y direction are necessary as the area for moving planewise the substrate. When a linear beam is used, the space can be somewhat limited and yet a wide space is still necessary.

When the laser irradiation apparatus becomes very great in size, the moving speed is limited, as well. Particularly when solid laser of continuous oscillation (CW: continuous-wave) is used, a large burden will be applied to the laser irradiation apparatus if the stage (a stage supporting thereon the substrate) is moved at a moving speed of 0.5 to 2,000 cm/sec such as 100 cm/sec, for example.

On the other hand, another irradiation system fixes a substrate position, irradiates a laser beam by use of a galvanomirror or a polygon mirror and moves the irradiated region in a transverse direction (X direction) relative to the substrate to scan the laser beam. When the galvanomirror or the polygon mirror is used for scanning the laser beam, the increase of the footprint can be restricted even when the substrate becomes large in size. Therefore, this system has the advantage that the increase of the size of the overall apparatus can be avoided. In addition, because the laser beam is scanned by oscillation of a mirror that is light in weight, the moving speed of the irradiated region can be freely set and a large burden is not applied to the laser irradiation apparatus.

When the laser beam is scanned by use of the galvanomirror or the polygon mirror, however, an angle of incidence of the laser beam to the semiconductor film varies depending on the position. When the angle of incidence to the semiconductor film varies, a reflection factor of the laser beam on the substrate surface and an absorption factor of the semiconductor film to the laser beam vary, too. In consequence, the problem arises that uniformity of laser annealing treatment is low.

SUMMARY OF THE INVENTION

To eliminate the various problems described above, a laser irradiation apparatus according to the invention uses a galvanomirror, a polygon mirror, an AOD (Acoustico-Optical Deflector), an electro-optical deflector (EO deflector), a resonant scanner, a hologram scanner or a conical scanner to irradiate and scan a laser beam to and on a semiconductor film, and includes means for keeping an angle of incidence $\theta$ ($\theta \neq 0$) of the laser beam always constant at a certain angle when the laser beam is irradiated.

More concretely, the angle of the semiconductor film (an angle between a horizontal plane and a semiconductor film surface) is changed in accordance with the movement of the galvanomirror or the polygon mirror so that the angle of incidence of the laser beam to the main surface of the semiconductor film can be kept constant. Angle adjustment means such as a goniometer or a manipulator is provided as means for adjusting the angle of the semiconductor film (the angle between the horizontal plane and the semiconductor film surface) and is appropriately adjusted. A sensor for measuring the angle of incidence may also be provided so as to adjust the movement of the galvanomirror or the polygon mirror or the angle adjustment means while measuring the angle of incidence.

The invention can decrease the size of the laser irradiation apparatus capable of coping with large substrates, can keep the angle of incidence of the laser beam to the irradiated surface constant and makes it possible to conduct uniform laser annealing.

Even when the position of the laser beam moves on the substrate in this invention, an energy density of the laser beam remains always constant on the surface of the semiconductor film. Therefore, it is not necessary to interpose an f-θ lens for adjusting the energy density in an optical path between a laser beam source and the substrate, and the increase of the cost of an optical system owing to the f-θ lens and aberration of the laser beam can be suppressed.

According to one aspect of the invention, there is provided a laser irradiation apparatus comprising laser; a unit (means) for moving an irradiation position of a laser beam on an irradiated surface by changing a traveling direction of the laser beam oscillated from the laser; and a unit(means) for controlling an angle of incidence of the laser beam to the irradiated surface to a constant angle on the basis of the moving unit(means).

According to another aspect of the invention, there is provided a laser irradiation apparatus comprising laser; a unit(means) for converting a shape of a laser beam oscillated from the laser on an irradiated surface to an elliptic or rectangular shape; a unit (means) for changing a traveling direction of the laser beam and moving an irradiation position of the laser beam on the irradiated surface in a first direction; a unit(means) for controlling an angle between a horizontal plane and the irradiated surface and keeping an angle of incidence of the laser beam to the irradiated surface constant on the basis of the moving unit(means); and a unit(means) for moving a treated object having the irradiated surface, and moving the irradiation position of the laser beam on the irradiated surface in a second direction.

According to still another aspect of the invention, there is provided a laser irradiation apparatus comprising laser; a cylindrical lens for converting a shape of a laser beam oscillated from the laser on an irradiated surface to an elliptic or rectangular shape; a convex lens for condensing the laser beam; a galvanomirror for moving an irradiation position of the laser beam in a first direction; and a stage for moving a treated object having the irradiated surface, and moving the irradiation position of the laser beam on the irradiated surface in a second direction; wherein the stage is controlled to an arbitrary angle with respect to a horizontal plane on the basis of an angle of the galvanomirror with respect to the laser beam and keeps an angle of incidence of the laser beam to the irradiated surface constant.

According to still another aspect of the invention, there is provided a laser irradiation apparatus comprising laser; a cylindrical lens for converting a shape of a laser beam oscillated from the laser on an irradiated surface to an elliptic or rectangular shape; a convex lens for condensing the laser beam; a polygon mirror for moving an irradiation position of the laser beam in a first direction; and a stage for moving a treated object having the irradiated surface, and moving the irradiation position of the laser beam on the irradiated surface in a second direction; wherein the stage is controlled to an arbitrary angle with respect to a horizontal plane on the basis of an angle of the polygon mirror with respect to the laser beam and keeps an angle of incidence of the laser beam to the irradiated surface constant.

According to still another aspect of the invention, there is provided a laser irradiation apparatus comprising laser; a cylindrical lens for converting a shape of a laser beam oscillated from the laser on an irradiated surface to an elliptic or rectangular shape; a convex lens for condensing the laser beam; a first galvanomirror for moving an irradiation position of the laser beam in a first direction; and a second galvanomirror for moving the irradiation position of the laser beam in a second direction; wherein the stage is controlled to an arbitrary angle with respect to a horizontal plane on the basis of an angle of the first or second galvanomirror with respect to the laser beam, and keeps an angle of incidence of the laser beam to the irradiated surface constant.

In the constructions 2 to 5 described above, the first direction and the second direction cross each other on a plane.

In the constructions 3 to 5 described above, the stage includes a unit(means) for fixing the irradiated object and a unit(means) for changing the angle of the irradiated object to the horizontal plane.

Also, the laser described in the foregoing may be a solid laser of a continuous oscillation (CW) or a pulse oscillation. For example, one or more of YAG laser, $YVO_4$ laser, YLF laser, $YAlO_3$ laser, $Y_2O_3$ laser, glass laser, ruby laser, alexandrite laser and Ti: sapphire laser may be used. Alternatively, a laser of a continuous oscillation or a pulse oscillation may be used. For example, one or more of excimer laser, Ar laser and Kr laser may be used.

In each of the constructions described above, the angle of incidence θ satisfies the formula 1 with respect to the irradiated surface.

$$\theta \geq \arctan(w/(2 \times d)) \qquad (1)$$

In each of the constructions described above, the stage is a goniometer or a manipulator.

Incidentally, the shape of the laser beam is different depending on the kind of the laser beam emitted from the laser, and even when the shape is adjusted by an optical system, it is likely to be affected by the original shape. For example, the shape of the laser beam emitted from XeCl excimer laser is rectangular and the shape of the laser beam emitted from solid laser is circular when a rod shape is cylindrical, and is rectangular when the rod shape is of a slab type. The invention can be applied to the shape of either type.

BRIEF DESCRIPTION OF THE DRAWINGS

FIGS. 3A1 to 3C2 show an Embodiment Mode 2;

FIG. 8 shows a module (Embodiment 3);

DESCRIPTION OF THE PREFERRED EMBODIMENTS

Modes for carrying out the invention (Embodiment Modes) will be hereinafter explained.

[Embodiment Mode 1]

This Mode 1 represents an apparatus, and a method, for irradiating a laser beam to an entire surface of a substrate by using second harmonics of continuous oscillation $YVO_4$ laser as a laser beam source 11 and a scanning unit 13 comprising one galvanomirror. In this Mode 1, the laser beam is scanned in an X direction of the substrate by way of example. A beam formation unit 12 comprising an optical system sets at this time the shape of the laser beam (laser spot) on the irradiated surface to an elliptic shape having a length of a minor diameter of 3 to 100 μm and a length of a major diameter to 100 μm or more. The laser spot may have a rectangular shape having a length of a minor side of 3 to 100 μm and a length of a major side of 100 μm or more in place of the elliptic shape. The shape is set to the rectangular or elliptic shape so as to efficiently laser-anneal the entire surface of the substrate. An operator can appropriately select the length of the major diameter (or the major side) when the laser beam has an energy density suitable for laser annealing.

Figure 1A:
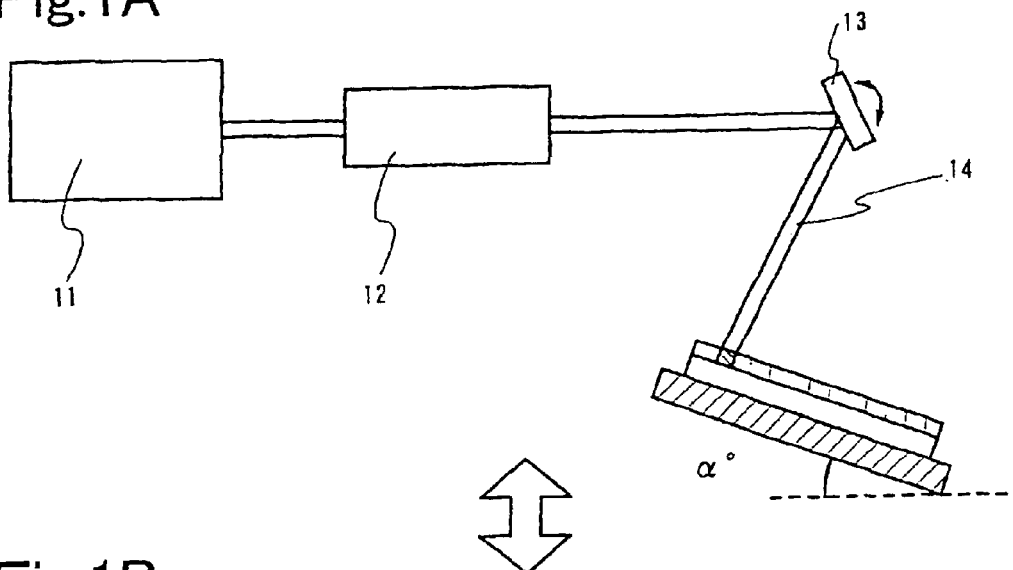
FIGS. 1A–C show a Mode 1 for carrying out the invention.
Figure 1B:
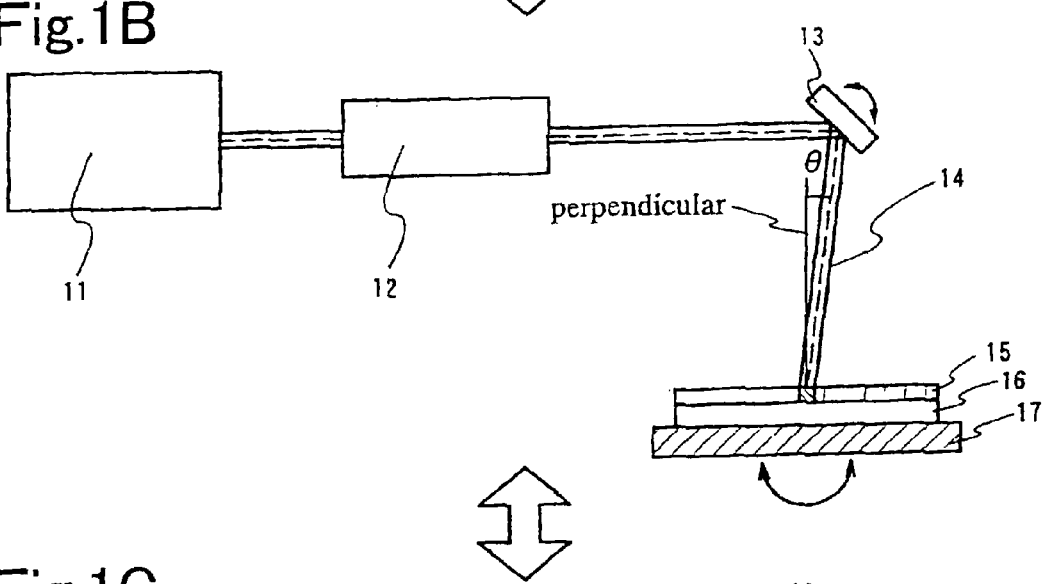
Figure 1C:
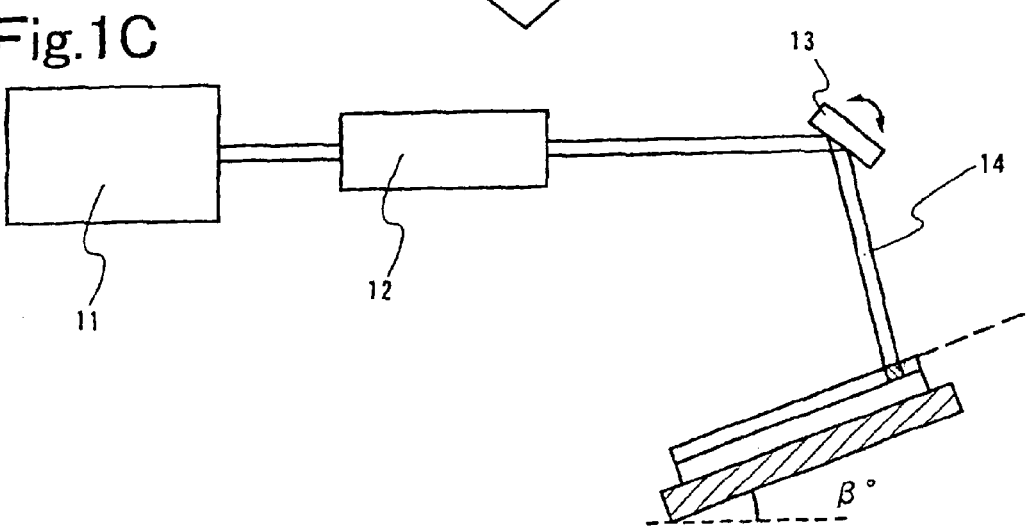

FIGS. 1A to 1C are schematic sectional views when the substrate is cut vertically on a plane inclusive of the X direction of the substrate. FIG. 1A shows the state where one of the end portions of an irradiated object (here, a semiconductor film 15 having an amorphous structure and arranged on the substrate 16) is irradiated. FIG. 1B shows the state where the center portion of the irradiated object is irradiated. FIG. 1C shows the state where the other end portion of the irradiated object is irradiated.

Referring to FIG. 1A, the laser beam 14 reflected by a galvanomirror 13 is incident into the semiconductor film 15 having an amorphous structure at an angle θ (θ≠0°) to the perpendicular in the X direction of the substrate. The laser beam is allowed at this time to be incident vertically to the Y direction of the substrate. In other words, the angle of incidence of the laser beam is θ in FIG. 1A. A stage 17 is tilted to an angle α relative to the horizontal plane in the interlocking arrangement with the angle of the galvanomirror 13 to keep of the angle of incidence θ.

Incidentally, the laser beam 14 is allowed to be incident at the angle of incidence θ into the semiconductor film 15 having the amorphous structure to reduce influences of interference between the laser beam incident into the substrate and the reflected beam from the back of the substrate when a laser beam having a wavelength transmitting through the semiconductor film and the substrate is used. In addition, when the laser beam is allowed to be incident at the angle of incidence θ into the semiconductor film, that is, when the laser beam is obliquely irradiated, the return beam, that is, the reflected beam from the substrate surface, does not reach a laser apparatus. This method is particularly effective when a solid laser is used for the laser beam source.

The angle of incidence may well satisfy the following formula 1 when the beam width incident into the irradiated object is w and the thickness of the substrate is d:

$$\theta \geq \arctan(w/(2 \times d)) \quad (1)$$

Figure 13:
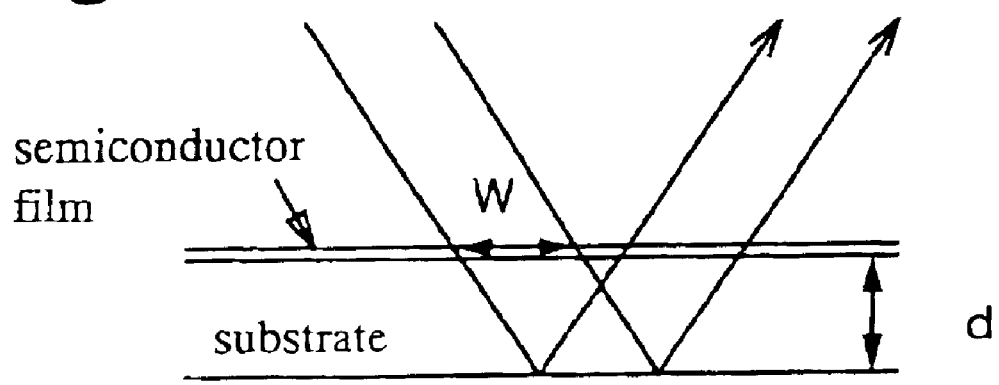
FIG. 13 shows a photograph of a beam width W.

Incidentally, w represents the beam width shown in FIG. 13.

Figure 14:
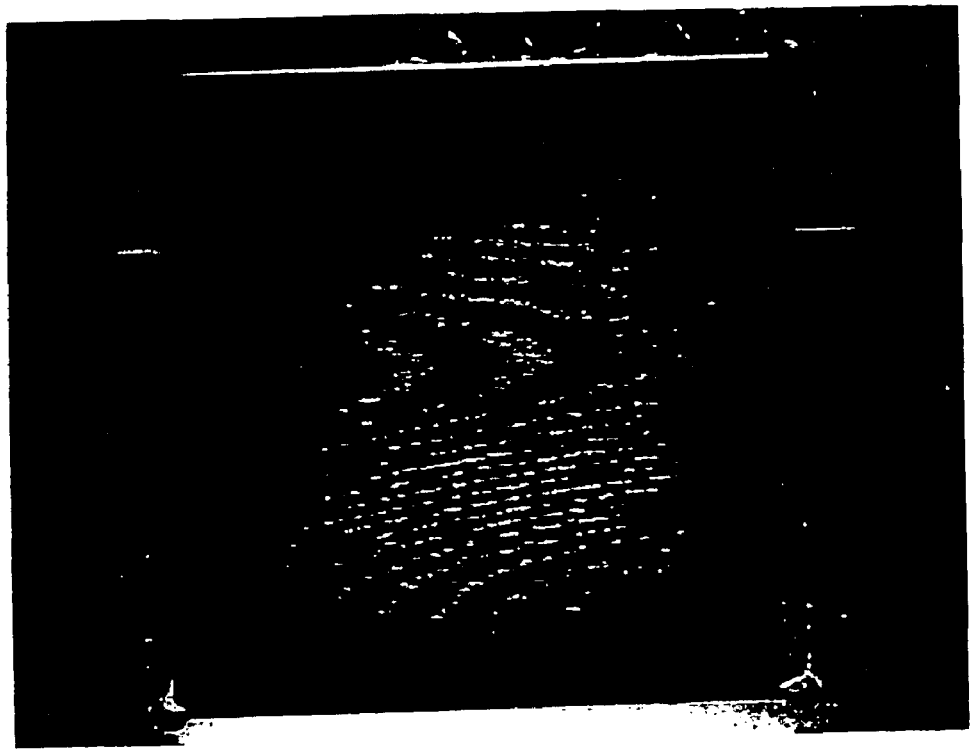
FIG. 14 shows a photograph of a comparative example.

For comparison, FIG. 14 shows a surface observation photograph after the laser beam is allowed to be incident vertically to the irradiated surface, that is, at an angle of incidence of 0°, into an amorphous silicon film. When the angle of incidence is 0°, a corrugated pattern is formed as shown in FIG. 14. If the substrate itself is slightly warped, interference occurs due to undulation of the substrate at this angle of incidence 0°, and laser annealing becomes non-uniform.

When the laser beam is irradiated at the angle of incidence θ satisfying the formula 1 given above, the corrugated pattern does not appear and uniform laser annealing can be conducted. When the laser beam is irradiated at the angle of incidence θ satisfying the formula 1, interference does not occur even when the substrate itself is slightly warped, and uniform laser annealing can be conducted.

The discussion given above is based on the assumption that the refractive index of the substrate is 1. In practice, however, the substrates mostly have refractive indices of about 1.5. When this numerical value is taken into consideration, a calculation value greater than the calculated angle described in the discussion given above is obtained. Because energy of the linear beam damps between both ends in the longitudinal direction, however, interference is less at both ends, and a sufficient interference damping effect can be acquired at the calculation value described above.

In FIG. 1B, too, the laser beam reflected by the galvanomirror 13 is incident into the semiconductor film 15 having the amorphous structure at the angle θ to the perpendicular in the X direction of the substrate. In FIG. 1B, too, the angle of incidence of the laser beam is θ. At this time, the stage 17 is so adjusted as to be parallel with the horizontal plane in the interlocking arrangement with the angle of the galvanomirror 13 and the angle of incidence is set to θ. When the irradiation region is elliptic or rectangular, the angle of incidence θ represents the angle between the laser beam passing through the center of the irradiation region indicated by dotted line in FIG. 1B and the perpendicular of the substrate.

In FIG. 1C, too, the laser beam reflected by the galvanomirror 13 is incident into the semiconductor film 15 having the amorphous structure at the angle θ to the perpendicular in the X direction of the substrate. In FIG. 1C, too, the angle of incidence of the laser beam is θ. At this time, the stage 17 is tilted at an angle a relative to the horizontal plane in the interlocking arrangement with the angle of the galvanomirror 13 and the angle of incidence is set to θ.

Therefore, means for changing the angle of the stage 17 relative to the horizontal plane in the interlocking arrangement with the movement of the galvanomirror, typically a goniometer, for always achieving the angle of incidence θ is provided to the stage 17. The stage provided with the goniometer is also called a "gonio-stage". It is a stage the center of revolution of which exists above the stage and the stage plane of which turns with the center as the support point. In the invention, the center of revolution of this stage 17 and that of the galvanomirror are preferably aligned with each other.

The irradiation region moves from one of the ends to the other of the semiconductor film 15 provided on the substrate 16, that is, the irradiated object, as the stage shown in FIGS. 1A to 1C is serially passed, and one linear orbit is drawn in the X direction of the substrate. As the galvanomirror 13 oscillates, the angle of the mirror of the galvanomirror changes with time and the position of the laser beam on the substrate moves in the X direction of the substrate. When the galvanomirror 13 oscillates in a half cycle, the laser beam moves from one of the ends to the other of the width of the substrate. When pulse oscillation laser is used, the oscillation rate of the galvanomirror is adjusted lest the irradiation region of the laser beam is interrupted.

This Mode 1 represents the example where the state shown in FIGS. 1A to 1C is serially passed but this sequence is not particularly restrictive. For example, irradiation may be conducted in the sequence of FIGS. 1C, 1B and 1A. The angle of incidence is always adjusted to θ while irradiation is conducted.

After one linear orbit is drawn, the stage 17 is moved in a certain predetermined pitch in the Y direction of the substrate (perpendicularly to the sheet of drawing in FIG. 1B), and the laser beam is serially irradiated. In consequence, the semiconductor film formed on the entire surface of the substrate can be efficiently converted from the amorphous structure to the crystalline structure. In other words, the stage 17 can be said as separate scanning means from the scanning unit 13 comprising the galvanomirror. Needless to say, it is also possible to irradiate a plurality of times the same region, then to move the irradiation region by the length of the major diameter (or the major side) of the laser beam and to again conduct irradiation.

Here, a method of crystallizing the semiconductor film having the amorphous structure by use of the irradiation method described above will be explained. When the laser beam is irradiated to the semiconductor film having the amorphous structure, the irradiated region becomes molten, and is cooled and solidified with the passage of time. When irradiation is conducted while the laser beam is being moved, the regions under the molten state are formed one after another, whereas the regions that are cooled and solidified in the course of time exist. In other words, a temperature gradient is formed in the semiconductor film, and the crystal grains grow in the moving direction of the laser beam to give the crystal grains having large diameters. Electric characteristics of TFT fabricated by using such crystal grains for a channel formation region can be improved. Eventually, operation characteristics and reliability of a semiconductor device can be improved, too. Particularly because the crystal grain boundary hardly exists in the moving direction of the laser beam, TFT having the channel formation region parallel with this direction is preferably fabricated.

When the irradiation method described above is employed, laser annealing can be efficiently conducted for a substrate having a large area, too. When the semiconductor film is crystallized by use of such laser annealing, a semiconductor film having large crystal grains that are position-controlled can be formed. Further, electric characteristics of TFT fabricated from such a semiconductor film can be improved, and operation characteristics and reliability of the semiconductor device can be improved, too.

Figure 2A:
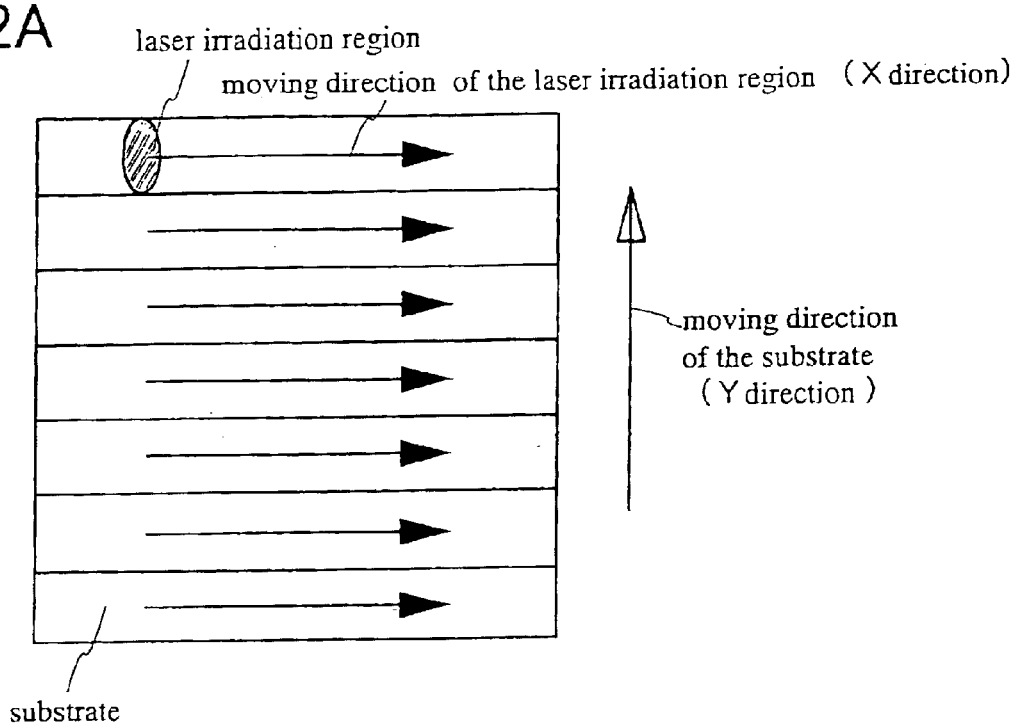
FIG. 2A and FIG. 2B show a relation between a moving direction of a laser irradiation region and a moving direction of a substrate.
Figure 2B:
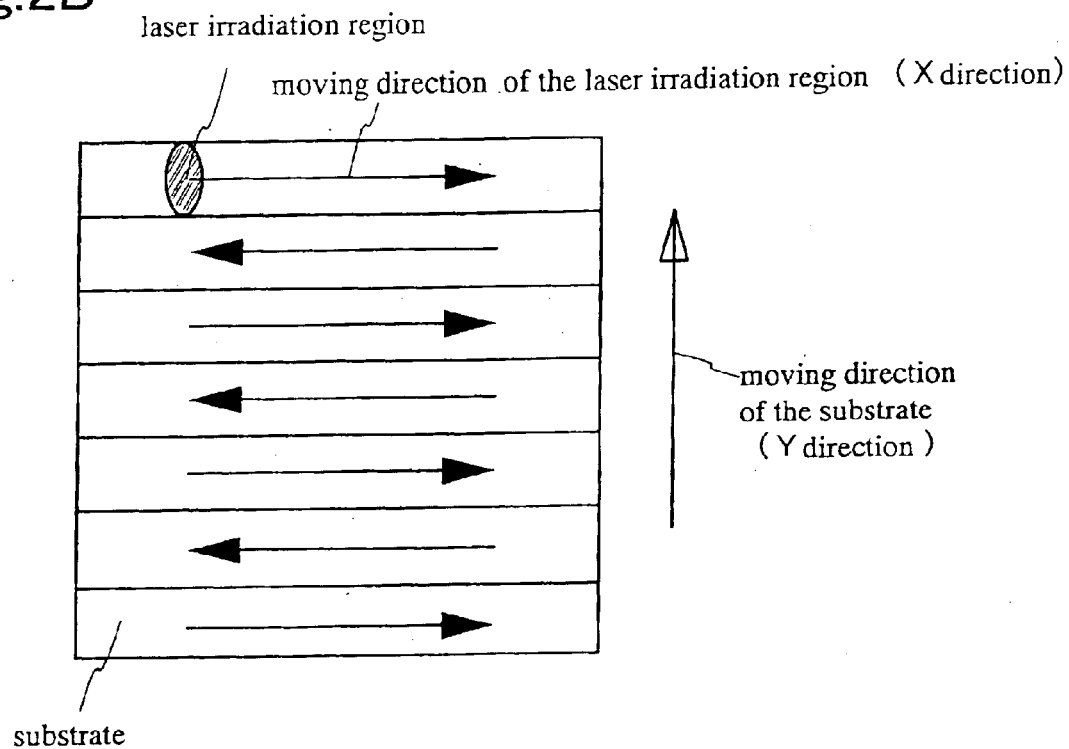

In this Mode 1, the scanning unit 13 comprising the galvanomirror scans the laser beam in the X direction of the substrate and the angle with the perpendicular in the X direction of the substrate is kept at the constant angle θ. As the stage 17 moves in the Y direction of the substrate, the laser beam is scanned in the Y direction of the substrate and the angle with the perpendicular in the Y direction of the substrate is kept constant at the angle 0°. In other words, the laser beam is irradiated while the angle of incidence θ is always kept. As the movement of the irradiation position due to revolution of the galvanomirror 13 and the movement of the stage 17 are repeated, the laser beam is irradiated to the entire surface of the substrate. Incidentally, FIG. 2A and FIG. 2B briefly shows the relation between the moving direction (X direction of the substrate) of the laser irradiation region on the substrate and the moving direction (Y direction of the substrate) of the substrate. The laser irradiation region may be scanned only uni-directionally as shown in FIG. 2A, or may be reciprocated as shown in FIG. 2B.

The angle of incidence θ of the laser beam (angle θ with the perpendicular in the X direction of the substrate and the angle 0° with the perpendicular in the Y direction of the substrate) can be thus kept constant and uniform annealing can be conducted.

Moreover, even when the position of the laser beam moves on the substrate, the energy density of the laser beam remains always constant on the surface of the semiconductor substrate. Therefore, it is not necessary to arrange an f-θ lens for adjusting the energy density in an optical path between the laser beam source and the substrate, and the rise of the cost of the optical system and aberration of the laser beam resulting from the f-θ lens can be suppressed.

In FIGS. 1A to 1C, the substrate 16 provided with the semiconductor film 15 having the amorphous structure is shown disposed on the stage 17 and is fixed by an adsorption unit or a mechanical fixing unit not shown in the drawings.

This Mode 1 uses the galvanomirror as the scanning unit 13 but is not limited thereto. It is possible to use, for example, a polygon mirror, an AOD (acoustic-optical deflector), an electro-optical defelector (EO deflector), a resonant scanner, a hologram scanner or a conical scanner in place of the galvanomirror.

The Mode 1 represents the example where the laser beam is irradiated to the semiconductor film having the amorphous structure to crystallize the semiconductor film. However, the embodiment is not particularly limited to the crystallization purpose but can be applied to a variety of laser annealing treatments typified by an activation treatment.

[Embodiment Mode 2]

The Mode 1 represents the case where the angle of the laser beam with the perpendicular in the X direction of the substrate is θ and the laser beam is scanned in the X direction of the substrate. This Mode 2 represents the example where the angle of the laser beam with the perpendicular in the Y direction of the substrate is θ and the laser beam is scanned in the X direction of the substrate.

FIGS. 3A1 to 3C1 are schematic sectional views when the substrate is cut vertically in a plane inclusive of the X direction of the substrate. FIGS. 3A2 to 3C2 are schematic side views when the substrate is cut vertically in a plane inclusive of the Y direction of the substrate.

The second harmonics of continuous oscillation $YVO_4$ laser are used as the laser beam source 21 and a scanning unit 23 comprising one galvanomirror scans the laser beam in the X direction of the substrate.

A beam formation unit 22 comprising an optical system converts the shape of the laser beam (laser spot) on the irradiated surface to an elliptic shape (or rectangular shape) having a length of the minor diameter (minor side) of 3 to 100 μm and a length of the major diameter (major side) to 100 μm or more.

In FIG. 3A1, the laser beam 24 reflected by the galvanomirror 23 is incident into the semiconductor film 25 having the amorphous structure at an angle 0° with the perpendicular in the X direction of the substrate. In FIG. 3A2 that is a side view corresponding to FIG. 3A1, the laser beam 24 reflected by the galvanomirror 23 is incident into the semiconductor film 25 having the amorphous structure at an angle θ with the perpendicular in the Y direction of the substrate. In other words, the angle of incidence of the laser beam is θ in FIGS. 3A1 and 3A2. The stage 27 is so tilted and adjusted at this time in the interlocking arrangement with the angle of the galvanomirror 23 as to attain the angle of incidence θ.

The angle of incidence θ may be the same angle of incidence θ that satisfies the formula 1 given above where the beam width at the time of incidence into the irradiation object is w and the thickness of the substrate is d in the same way as in the Mode 1.

In FIG. 3B1, too, the laser beam reflected by the galvanomirror 23 is vertically incident into the semiconductor film 25 having the amorphous structure. In FIG. 3B2 that is a side view corresponding to FIG. 3B1, the laser beam 24 reflected by the galvanomirror 23 is incident into the semiconductor film 25 having the amorphous structure at the angle θ with the perpendicular in the Y direction of the substrate. In other words, the angle of incidence of the laser beam is θ in FIGS. 3B1 and 3B2. The stage 27 is tilted and adjusted at this time in the interlocking arrangement with the angle of the galvanomirror 23 so that it is in parallel with the horizontal plane and the angle of incidence θ is attained.

In FIG. 3C1, too, the laser beam reflected by the galvanomirror 23 is vertically incident into the semiconductor film 25 having the amorphous structure. In FIG. 3C2 that is a side view corresponding to FIG. 3C1, the laser beam 24 reflected by the galvanomirror 23 is incident into the semiconductor film 25 having the amorphous structure at an angle θ with the perpendicular in the Y direction of the substrate. In other words, the angle of incidence of the laser beam is θ in FIGS. 3C1 and 3C2. The stage 27 is so tilted and adjusted at this time in the interlocking arrangement with the angle of the galvanomirror 23 as to attain the angle of incidence θ.

Therefore, a unit(means) for changing the angle of the stage 27 relative to the horizontal plane in the interlocking arrangement with the movement of the galvanomirror, typically a goniometer, for always achieving the angle of incidence θ into semiconductor film 25 is provided to the stage 27. In the invention, the center of revolution of this stage 27 and that of the galvanomirror are preferably aligned with each other.

The irradiation region moves from one of the ends to the other of the semiconductor film 25 provided to the substrate 26 as the irradiated object, that is, the stage shown in FIGS. 3A1 to 3C1, is serially passed, and one linear orbit is drawn in the X direction of the substrate.

This Mode 2 represents the example where the state shown in FIGS. 3A1 to 3C1 is serially passed but is not particularly limited thereto. For example, irradiation may be conducted in the sequence of FIGS. 3C1, 3B1 and 3A1.

After one linear orbit is drawn, the stage 27 is moved in a certain predetermined pitch in the Y direction of the substrate, and the laser beam is serially irradiated. In consequence, the semiconductor film formed on the entire surface of the substrate can be efficiently converted from the amorphous structure to the crystalline structure.

In this Mode 2, the scanning unit 23 comprising the galvanomirror scans the laser beam in the X direction of the substrate and the angle with the perpendicular in the X direction of the substrate is kept at the constant angle 0°. As the stage 27 moves in the Y direction of the substrate, the laser beam is scanned in the Y direction of the substrate and the angle with the perpendicular in the Y direction of the substrate is kept constant at the angle θ. In other words, the laser beam is irradiated to the entire surface of the substrate while the angle of incidence θ is always kept. As the movement of the irradiation position due to revolution of the galvanometer 23 and the movement of the stage 27 are repeated, the laser beam is irradiated to the entire surface of the substrate. Incidentally, the laser irradiation region may be scanned only uni-directionally as shown in FIG. 2A, or may be reciprocated as shown in FIG. 2B.

The angle of incidence of the laser beam (angle 0° with the perpendicular in the X direction of the substrate and the angle θ with the perpendicular in the Y direction of the substrate) can be thus kept constant and uniform annealing can be conducted.

Moreover, even when the position of the laser beam moves on the substrate, the energy density of the laser beam remains always constant on the surface of the semiconductor substrate. Therefore, it is not necessary to arrange an f-θ lens for adjusting the energy density in an optical path between the laser beam source and the substrate, and the rise of the cost of the optical system and aberration of the laser beam resulting from the f-θ lens can be suppressed.

In FIGS. 3A1 to 3C1, the substrate 26 provided with the semiconductor film 25 having the amorphous structure is shown disposed on the stage 27 and is fixed by an adsorption unit or a mechanical fixing unit not shown in the drawings.

This Mode 2 uses the galvanomirror as the scanning unit 23 but is not limited thereto. It is possible to use, for example, a polygon mirror, an AOD (acoustic-optical deflector), an electro-optical deflector (EO deflector), a resonant scanner, a hologram scanner or a conical scanner in place of the galvanometer.

The Mode 2 represents the example where the laser beam is irradiated to the semiconductor film having the amorphous structure to crystallize the semiconductor film. However, the Mode 3 is not particularly limited to the crystallization purpose but can be applied to a variety of laser annealing treatments typified by an activation treatment.

[Embodiment Mode 3]

This Mode 3 uses a polygon mirror. An apparatus, and a method, for irradiating a laser beam to an entire surface of a substrate will be explained with reference to FIGS. 4A–C. Incidentally, this Mode 3 is fundamentally the same as the Mode 1 with the exception that the polygon mirror is used in place of the galvanomirror used in the Mode 1. Therefore, only the difference will be described.

Figure 4A:
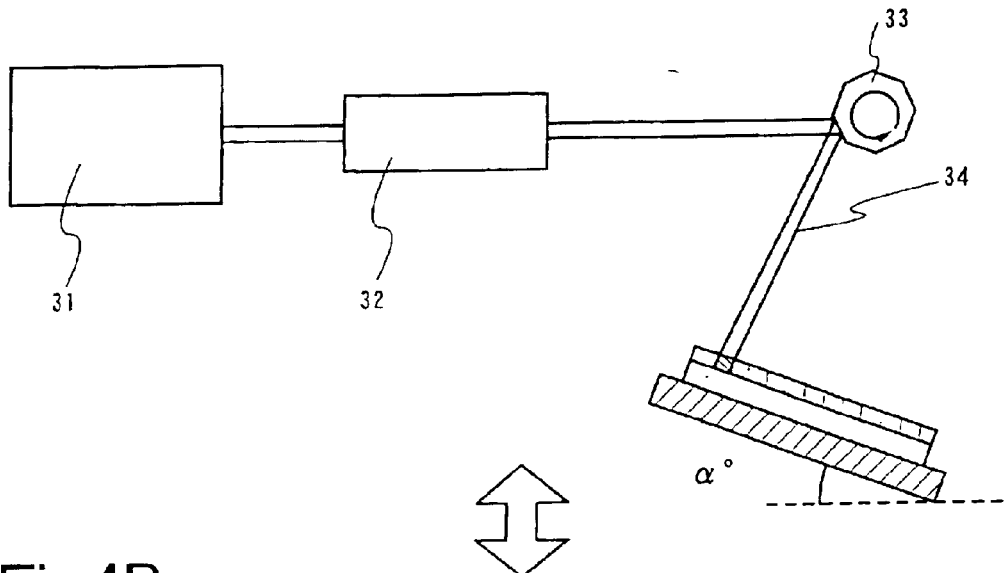
FIGS. 4A–C show an Embodiment Mode 3.
Figure 4B:
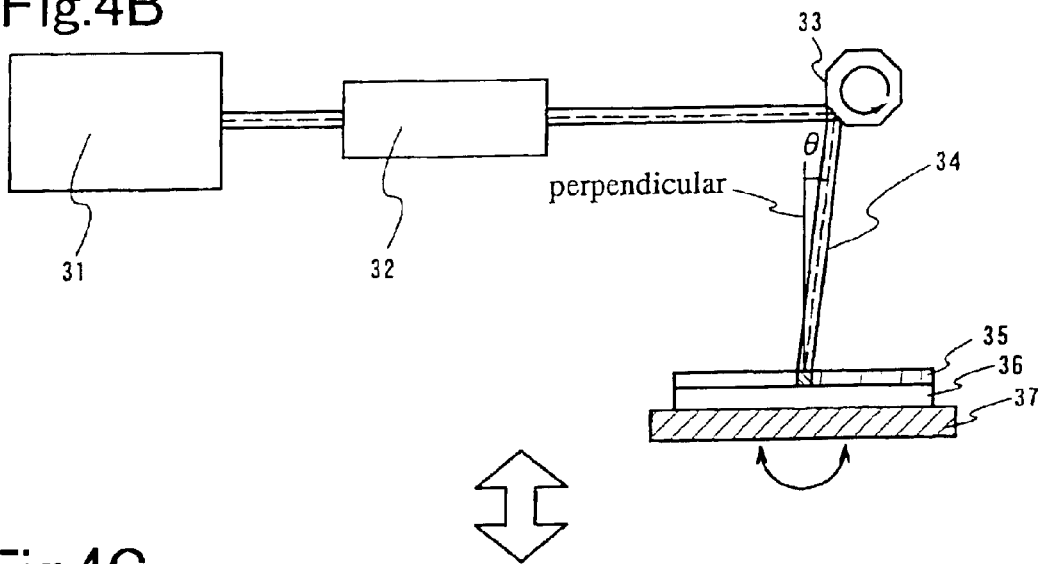
Figure 4C:
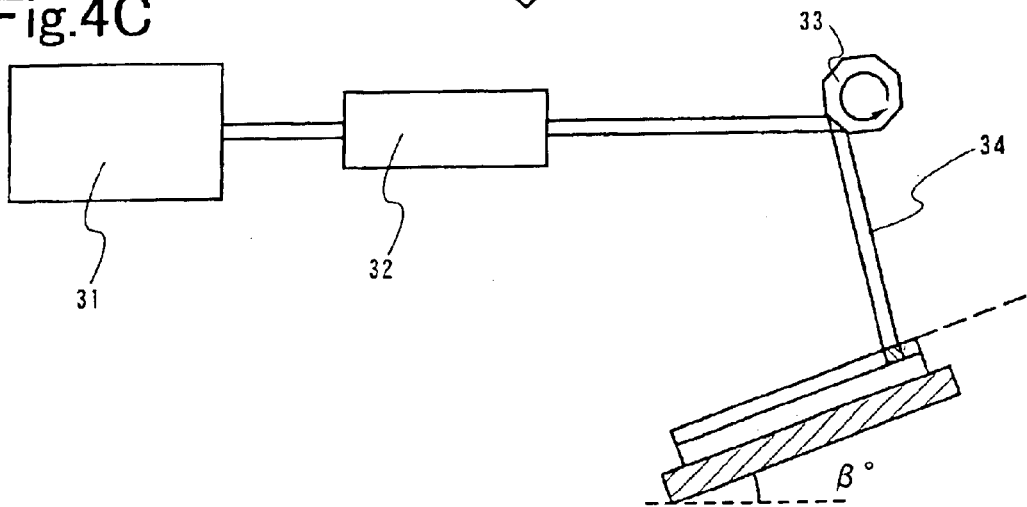

FIGS. 4A to 4C are schematic sectional views when the substrate is cut vertically in a plane inclusive of the X direction of the substrate. FIG. 4A shows the state where one of the end portions of an irradiated object (here, a semiconductor film 35 having an amorphous state and disposed on the substrate 36) is irradiated. Next, FIG. 4B shows the state where the center portion of the irradiated object is irradiated. FIG. 4C shows the state where the other end portion of the irradiated object is irradiated.

In FIG. 4A, a laser beam 34 reflected by a polygon mirror 33 is incident into the semiconductor film 35 having the amorphous structure at an angle θ with the perpendicular in the X direction of the substrate. At this time, the laser beam is vertically incident in the Y direction of the substrate. In other words, the angle of incidence of the laser beam is θ in FIG. 4A. A stage 37 is so tilted and adjusted at this time in the interlocking arrangement with the angle of the galvanomirror 33 as to attain an angle α with respect to the horizontal plane.

The polygon mirror 33 includes a plurality of mirrors. When the polygon mirror 33 turns, the angle of the mirror changes with time, and the position of the laser beam on the substrate moves in a direction of arrow indicated in FIG. 2A. While the polygon mirror turns, the laser beam oscillates at a predetermined position, but is adjusted so as to move from one of the ends of the width of the substrate to the other. The inclination of the stage 37 is adjusted so that the angle of incidence θ of the laser beam and its energy density always remain constant on the substrate even when the position of the laser beam moves on the substrate.

It is thus possible to keep the angle of incidence θ of the laser beam (angle θ with the perpendicular in the X direction of the substrate and the angle 0° with the perpendicular in the Y direction of the substrate) constant, and uniform annealing can be conducted.

This Mode 3 represents the example where the angle of the laser beam with the perpendicular in the X direction of the substrate is θ and the laser beam is scanned in the X direction of the substrate. However, the angle of the laser beam with the perpendicular in the Y direction may be set to θ and the laser beam may be scanned in the X direction of the substrate as represented in the Mode 2.

The invention having the construction described above will be explained in further detail with reference to embodiments thereof.

[Embodiment 1]

Figure 5:
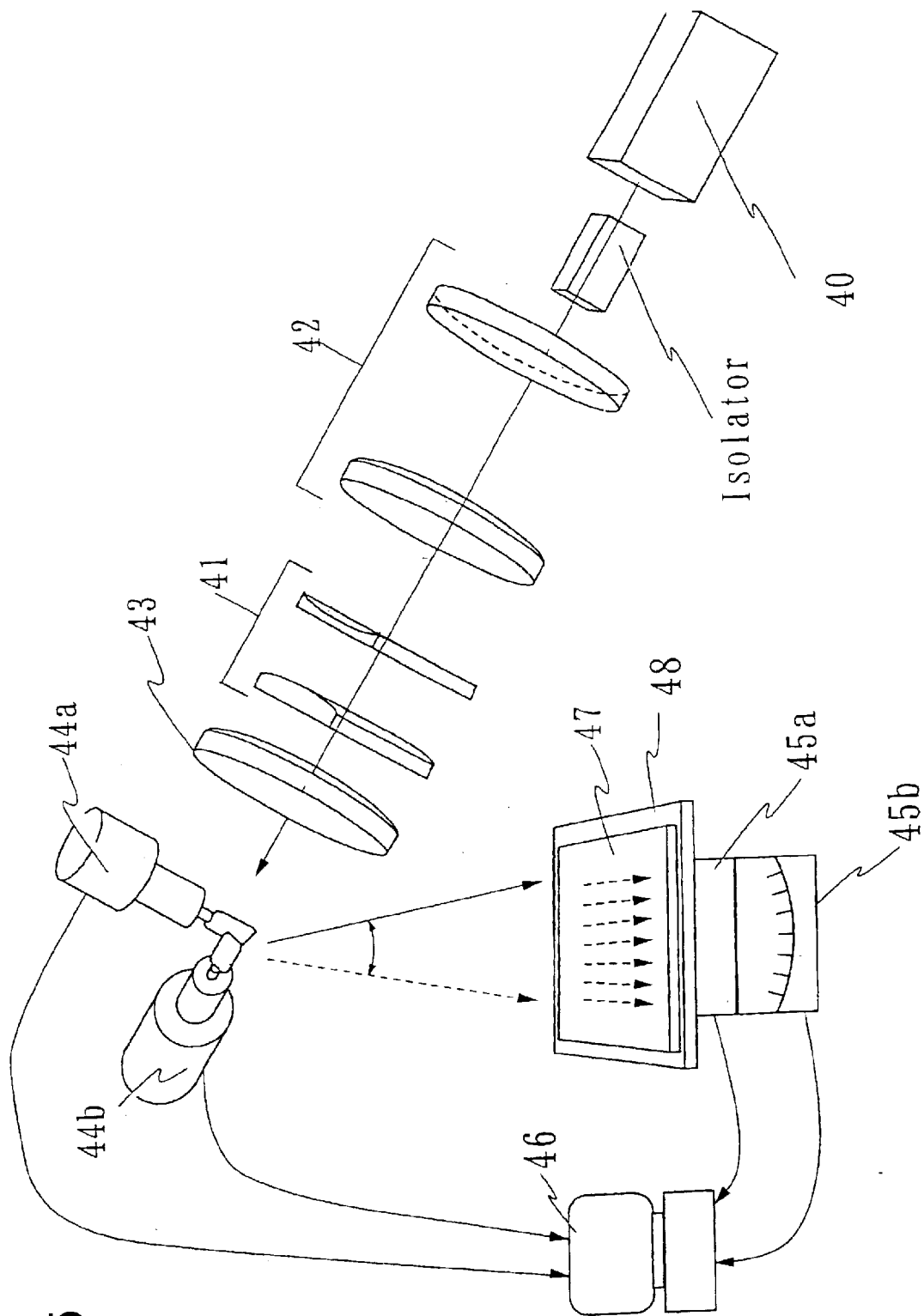
FIG. 5 shows an Embodiment 1.

This embodiment represents an example of a laser irradiation apparatus for moving a laser irradiation region by use of two galvanomirrors as shown in FIG. 5.

First, an optical system including a first beam expander 41 having a plurality of cylindrical lenses converts a shape of a laser beam outgoing from a laser oscillator (called also a "laser beam source") 40 to an elliptic shape on an irradiated surface. This embodiment uses second harmonics (wavelength: 532 nm) of $YVO_4$ laser having high condensing property as the laser beam source and a $TEM_{oo}$ laser beam having an output of 10 W and an expansion angle of 0.25 mrad.

To condense the laser beam, a second beam expander 42 including a plurality of spherical lenses and a convex lens 43 may well be arranged in an optical path of the laser beam. The second beam expander 42 is used to reduce the expansion angle of the laser beam. Assuming that the second beam expander 42 has a magnification ratio X, for example, the expansion angle of the laser beam is 1/X of its expansion angle before the incidence to the second beam expander 42, and the laser beam can be condensed to a smaller irradiation region.

In this embodiment, the second beam expander 42 having the spherical lens of 2X expands the laser beam outgoing from the laser beam source, and the first beam expander 41 having the cylindrical lenses of 8X unidirectionally expands the laser beam. The convex lens 43 having a focal length of 400 mm condenses the laser beam.

After passing through a beam formation unit (optical system) constituted by the first beam expander 41, the second beam expander 42 and the convex lens 43, the laser beam is then allowed to be incident into galvanomirrors 44a and 44b. These galvanomirrors 44a and 44b change the direction of the laser beam so that the laser beam is irradiated to a semiconductor film arranged on a substrate 47. In this embodiment, the laser beam can have an elliptic beam shape having minor and major diameters of 50 μm and 400 μm ($1/e^2$ width), respectively.

Though the laser beam on the irradiation surface has the elliptic shape in this embodiment, the beam shape is not particularly limited. When the area of the irradiation region is to be increased so as to improve through-put, the shape of the laser beam is preferably elongated as much as possible in the direction of the major diameter (or the major side). Various methods are available for elongating the laser beam. Typically, it is possible to employ a method that unidirectionally elongate the laser beam by using one cylindrical lens, or a method that elongates the laser beam by using two cylindrical lenses as a pair to constitute a beam expander.

When a laser oscillator using a slab type rod is employed, the laser beam is an elongated rectangular laser beam in the outgoing stage. Therefore, a relatively elongated laser beam can be formed. When the laser oscillator using the slab type rod is combined with a beam expander having cylindrical lenses, a further elongated laser beam can be desirably formed.

The galvanomirror 44a capable of moving the laser irradiation region in the X direction of the substrate and the galvanomirror 44b capable of moving the laser irradiation region in the Y direction of the substrate can together scan the laser beam in the two-dimensional range on the substrate. When the elliptic laser beam is scanned at a moving speed of dozens to hundreds of cm/sec to a semiconductor film having an amorphous structure (typically, an amorphous silicon film), a semiconductor film having a crystalline structure having large crystals extending in the scanning direction (typically, a poly-silicon film) can be acquired. Incidentally, the scanning direction is preferably a direction that provides the highest annealing efficiency, that is, the minor diameter direction of the elliptic beam.

An active matrix type liquid crystal display device includes a plurality of TFTs for a pixel portion and for a driving circuit (a source driver portion and a gate driver portion) that are formed on one glass substrate. To improve through-put and to reduce the production cost, it is customary to fabricate in most cases a panel for a plurality of liquid crystal display devices by using a substrate having a large area. Further, in the pixel portion and in the driving circuit portion, particularly in the source driver portion and in the gate driver portion in the driving circuit portion, the directions of the channel formation region (carrier flowing directions) are not in most cases coincident. Even when crystal grains aligned unidirectionally are formed through laser annealing and a channel formation region having a small number of grain boundaries are formed in the source driver portion, for example, the channel formation region in the gate driver portion has a large number of grain boundaries with the result that operation characteristics and reliability of the semiconductor device are deteriorated in some cases.

It is therefore preferred to form crystal grains having large particle diameters that do not impede the carrier flowing direction in the respective driver portions. In other words, the flow of the carriers is rendered smooth by the galvanomirror in the source driver portion when the crystal grains having large particle diameters are formed in a certain one direction and the channel formation region is formed in the same direction. In the gate driver portion, the crystal grains having large particle diameters are formed in a certain one direction by the galvanomirror and the flow of the carrier is rendered smooth by forming the channel formation region in the same direction.

A stage 48 on which the substrate 47 is installed is arranged on two goniometers 45a and 45b the axes of which cross each other. The angles of these goniometers 45a and

45b (the angle of the substrate relative to the horizontal plane) can be suitably adjusted in match with the movement of the galvanomirrors 44a and 44b. A computer 46 always controls the two goniometers 45a and 45b and the galvanomirrors 44a and 44b in such a fashion that the angle of incidence of the laser beam remains always constant. It is also possible to connect a sensor, not shown, for measuring the angle of incidence to the computer 46 and to adjust the galvanomirrors 44a and 44b or the goniometers 45a and 45b while measuring the angle of incidence.

The angle of the first goniometer 45a between the X direction of the substrate and the horizontal plane is changed. The angle of the second goniometer 45b between the Y direction of the substrate and the horizontal plane is changed. Therefore, the inclination of the semiconductor film disposed on the substrate (the angle with respect to the horizontal surface) can be freely adjusted.

A manipulator capable of freely adjusting the angles may be used in place of the two goniometers the axes of which cross one another.

An adsorption unit or a mechanical fixing unit, not shown, fixes the substrate 47 to the stage 48.

The laser irradiation apparatus according to this embodiment does not need the spaces for moving the substrate in the X and Y directions. Therefore, a foot-print can be reduced, and a compact laser irradiation apparatus can be accomplished. The laser irradiation apparatus of this embodiment scans the laser beam through only the galvanometers 44a and 44b. Therefore, the burden to the apparatus can be reduced in comparison with a laser irradiation apparatus that moves the substrate in both X and Y directions.

In the laser irradiation apparatus of this embodiment, the angle of incidence of the laser beam to the irradiated surface can be kept constant and uniform laser annealing can be conducted when the galvaonomirrors 44a and 44b and the goniometers 45a and 45b are adjusted. In consequence, it is not necessary to arrange an f-θ lens for adjusting the energy density in an optical path between the laser beam source and the substrate, and the increase of the cost of the optical system and aberration of the leaser beam resulting from the f-θ lens can be suppressed.

When such a laser irradiation apparatus is used to laser anneal the semiconductor film, it is possible to crystallize the semiconductor film, to obtain a crystalline semiconductor film by improving crystallinity, or to activate impurity elements.

[Embodiment 2]

This embodiment explains in detail a production method for producing a light-emitting device having OLED by simultaneously fabricating TFT of a pixel portion (n-channel TFT and p-channel TFT) and TFT of a driving circuit (n-channel TFT and p-channel TFT) to be formed around the pixel portion on the same substrate. In this embodiment, it is possible to use a substrate formed of glass such as barium borosilicate glass or alumino-borosilicate glass, a quartz substrate, a silicon substrate, a metal substrate or a substrate having an insulating film formed on a stainless steel substrate. It is further possible to use a plastic substrate having heat resistance to withstand the treating temperature in this embodiment, or a flexible substrate. When the laser irradiation apparatus of the invention is used for the laser annealing treatment in the fabrication process of TFT, the laser beam having the same energy distribution can be irradiated while the angle of incidence θ is kept constant, and a substrate having a large area can be efficiently annealed.

First, a silicon oxide nitride film (composition ratio: Si=32%, O=27%, N=24%, H=17%) as a lower layer 301 of a foundation insulating film is formed to a thickness of 50 nm (preferably, 10 to 200 nm) on a 0.7 mm-thick heat-resistant glass substrate (first substrate 300) by a plasma CVD process at a film formation temperature of 400° C. by use of starting gases $SiH_4$, $NH_3$ and $N_2O$. After the surface is washed with ozone water, the oxide film on the surface is removed with diluted hydrofluoric acid (1/100 dilution). Next, a silicon oxide nitride film (composition ratio: Si=32%, O=59%, N=7%, H=2%) as an upper layer 302 of the foundation insulating film is formed and stacked to a thickness of 50 nm (preferably, 10 to 200 nm) by the plasma CVD process by use of starting gases $SiH_4$ and $N_2O$. Furthermore, a semiconductor film (here, an amorphous silicon film) having an amorphous structure is formed and stacked to a thickness of 54 nm (preferably, 25 to 200 nm) by the plasma CVD process by use of the film forming gas of $SiH_4$ by the plasma CVD process at the film formation temperature of 300° C. without releasing the reaction gas to the atmosphere.

In this embodiment, the foundation insulating layer has the two-layered structure, but it may have a single layer film of an insulating film consisting of silicon as a principal component or a multi-layered structure of two or more layers. The material of the semiconductor film is not limited. Preferably, silicon or a silicon germanium ($Si_xGe_{1-x}$(x=0.0001 to 0.02)) alloy is used, and known means (sputtering, LPCVD or plasma CVD) is employed to form the semiconductor film. The plasma CVD apparatus may be of a sheet type or a batch type. The foundation insulating film and the semiconductor film may be continuously formed inside the same film formation chamber without exposing them to the atmosphere.

Next, after the surface of the semiconductor film having the amorphous structure is washed, an extremely thin oxide film of about 2 nm is formed on the surface by using ozone water. A trace amount of an impurity element (boron or phosphorus) is then doped to control a threshold value of TFT. This embodiment uses an ion doping method by plasma exciting diborane ($B_2H_6$) without mass separation. As the doping condition, an acceleration voltage is 15 kV, a gas prepared by diluting diborane with hydrogen to 1% is caused to flow at a flow rate of 30 sccm and boron is doped to the amorphous silicon film at a dose of $2\times10^{12}/cm^2$.

Next, a nickel acetate solution containing 10 ppm of nickel in terms of weight calculation is applied by using a spinner. The nickel element may be sprayed to the entire surface by sputtering in place of coating.

Heat-treatment is carried out to crystallize the semiconductor film and to obtain a semiconductor film having a crystalline structure. This beat-treatment can use heat-treatment inside an electric furnace or irradiation of strong light. When the heat-treatment is carried out inside the electric furnace, it can be carried out at 500 to 650° C. for 4 to 24 hours. After heat-treatment for dehydrogenation (at 500° C. for 1 hour) is carried out, heat-treatment for crystallization (at 550° C. for 4 hours) is carried out to obtain a silicon film having a crystalline structure. Here, heat-treatment inside the furnace is carried out for crystallization, but crystallization may be achieved by use of a lamp annealing apparatus capable of attaining crystallization within a short time.

After an oxide film on the surface of the silicon film having the crystalline structure is removed with diluted hydrofluoric acid, second to fourth harmonics of the fundamental wave are irradiated to the semiconductor film by use of solid laser capable of continuous oscillation to obtain crystal grains having large particle diameters. The laser beam may be irradiated in the atmosphere, in an oxygen atmosphere, in an inert gas or in vacuum. When it is conducted in the atmosphere or in the oxygen atmosphere, an oxide film is formed on the surface due to irradiation of the laser beam. Typically, the second harmonics (532 nm) or the third harmonics (355 nm) of Nd:YVO$_4$ laser (fundamental wave: 1,064 nm) may be applied. A non-linear optical device converts the laser beam emitted from YVO$_4$ laser of continuous oscillation having a 10 W output to the harmonics. Another method places the YVO$_4$ crystal and the non-linear optical device into a resonator and emits the harmonics. Preferably, an optical system shapes the laser beam to a rectangular or elliptic laser beam on the irradiation surface and irradiates the laser beam to a treated object. The energy density at this time must be 0.01 to 100 MW/cm$^2$ (preferably 0.1 to 10 MW/cm$^2$). The laser beam is irradiated while the semiconductor film is relatively moved at a rate of about 10 to about 2,000 cm/sec.

The irradiation method of the laser beam and its scanning method may be those of any of Embodiment Modes 1 to 3 and the Embodiment 1, and the laser beam is irradiated to the semiconductor film.

It is of course possible to fabricate TFT by use of a silicon film having a crystalline structure before the irradiation of the second harmonics of continuous oscillation YVO$_4$ laser. However, since the silicon film having the crystalline structure after the irradiation of the laser beam has improved crystallinity, the electric characteristics of TFT can be desirably improved. When TFT is fabricated by use of the silicon film having the crystalline structure after the irradiation of the laser beam, for example, mobility attains an extremely high value of 500 to 600 cm$_2$/Vs.

Here, nickel is used as a metal element for promoting crystallization of silicon. After crystallization, the second harmonics of continuous oscillation YVO$_4$ laser are further irradiated. However, the method is not limited, in particular, and it is also possible to first form a silicon film having an amorphous structure, then to carry out heat-treatment for dehydrogenation and to irradiate the second harmonics of continuous oscillation YVO$_4$ laser to acquire a silicon film having a crystalline structure.

Laser of pulse oscillation can also be used in place of continuous oscillation laser. When excimer laser of pulse oscillation is used, the laser energy density is preferably set to 100 to 1,000 mJ/cm$^2$ (typically 200 to 800 mJ/cm$^2$) by use of the laser irradiation apparatus and the irradiation method of any of the Embodiment Modes 1 to 3 and Embodiment 1. At this time, 50 to 98% of the laser beam may be overlapped.

Next, the surface of the of the oxide film formed by the irradiation of the laser beam is treated with ozone water for 120 seconds and a barrier layer of 1 to 5 nm-thick oxide film is formed. This embodiment uses ozone water to form the barrier layer. However, the barrier layer may be formed by employing a method that irradiates ultraviolet rays to the semiconductor film having the crystalline structure in an oxygen atmosphere to oxidize the surface, a method that conducts oxygen plasma treatment to oxidize the surface of the semiconductor film having the crystalline structure, or a method that deposits a 1 to 10 nm-thick oxide film by employing plasma CVD, sputtering or vacuum deposition to form the barrier layer. It is further possible to remove the oxide film formed by the irradiation of the laser beam before the barrier layer is formed.

Next, an amorphous silicon film containing an argon element as a gettering site is formed to a thickness of 50 to 400 nm, here to 150 nm, on the barrier layer in accordance with plasma CVD or sputtering. In this embodiment, the film is formed through sputtering using a silicon target at a pressure of 0.3 Pa in an argon atmosphere.

The silicon film is placed into a furnace heated to 650° C., and is heat-treated for 3 minutes for gettering to reduce a nickel concentration in the semiconductor film having the crystalline structure. A lamp annealing apparatus may be used in place of the furnace.

The amorphous silicon film containing the argon element as the gettering site is selectively removed with the barrier laser as an etching stopper, and the barrier layer is selectively removed with diluted hydrofluoric acid. Nickel is likely to move to a region having a high nickel concentration. It is therefore desired to remove the barrier layer consisting of the oxide film after gettering.

After an oxide film is formed with ozone water on the surface of the resulting silicon film having the crystalline structure (called also a "poly-silicon film"), a mask of a resist is formed and is then etched into a desired shape to form semiconductor layers that are isolated in an island form. The semiconductor layer is formed and the mask of the resist is then removed.

The oxide film is removed with an etchant containing hydrofluoric acid and at the same time, the surface of the silicon film is washed and an insulating film consisting of silicon as a principal component is formed as a gate insulating film 303. Here, a silicon oxide nitride film (composition ratio: Si=32%, O=59%, N=7%, H=2%) is formed through plasma CVD to a thickness of 115 nm.

Next, a first conductor film having a film thickness of 20 to 100 nm and a second conductor film having a film thickness of 100 to 400 nm are formed and stacked on the gate insulating film. In this embodiment, a 50 nm-thick tantalum nitride film and a 370 nm-thick tungsten film are serially stacked on the gate insulating film 303 and are patterned in the following sequence to give each gate electrode and each wiring.

An element selected from the group consisting of Ta, W, Ti, Mo, Al and Cu, or an alloy or compound material consisting of such an element as a principal component, may be used as a conductor material for forming the first and second conductor films. Semiconductor films typified by a poly-silicon film doped with an impurity element such as P or an AgPdCu alloy may be used for the first and second conductor films. The film structure is not limited to the two-layered structure but may be a three-layered structure formed by serially stacking a 50 nm-thick tungsten film, a 500 nm-thick aluminum-silicon alloy (Al—Si) film and 30 nm-thick titanium nitride film, for example. When this three-layered structure is employed, tungsten nitride may be used in place of tungsten of the first conductor film and an aluminum-titanium alloy film (Al—Ti) may be used in place of the aluminum-silicon alloy film (Al—Si) of the second conductor film. Further, a titanium film may be used in place of the titanium nitride film of the third conductor layer. A single layer structure may be used, as well.

ICP (Inductively Coupled Plasma) etching is preferably employed to etch the first and second conductor films (the first and second etching treatment). When ICP etching is employed and an etching condition (power applied to a coil type electrode, power applied to an electrode on the substrate side and an electrode temperature on the substrate side) is appropriately controlled, the film can be etched to a desired taper shape. In this embodiment, after a mask of a resist is formed, 700 W RF (13.56 MHz) power is applied to the coil type electrode at a pressure of 1 Pa as the first etching condition. CF$_4$, Cl$_2$ and O$_2$ are used as the etching gases and their gas flow rate ratio is set to 25/25/10 (sccm).

150 W RF (13.56 MHz) power is applied to the substrate side (sample stage), and a substantially negative self-bias voltage is applied. The electrode area size on the substrate side is 12.5 cm×12.5 cm. The area size of the coil type electrode (quartz disk provided with coil) has a diameter of 25 cm. The W film is etched under this first etching condition to convert the end portion to a taper shape. The etching condition is changed to the second etching condition without removing the mask of the resist. Namely, $CF_4$ and $Cl_2$ are used as the etching gases and their gas flow rate ratio is set to 30/30 (seem). 500 W RF (13.65 MHz) power is applied to the coil type electrode at a pressure of 1 Pa to generate plasma, and etching is carried out for about 30 seconds. 20 W RF (13.56 MHz) power is applied to the substrate side (sample stage) and a substantially negative self-bias voltage is applied. Under the second etching condition where $CF_4$ and $Cl_2$ are mixed, the W film and the TaN film are etched to the same level. Here, the first and second etching conditions are called "first etching treatment".

Next, the second etching treatment is carried out without removing the mask of the resist. The third etching condition uses $CF_4$ and $Cl_2$ as the etching gases, and their gas flow rate ratio is set to 30/30 (sccm). 500 W RF (13.65 MHz) power is applied to the coil type electrode at a pressure of 1 Pa to generate plasma, and etching is carried out for 60 seconds. 20 W RF (13.56 MHz) power is applied to the substrate side (sample stage) and a substantially negative self-bias voltage is applied. Thereafter, the etching condition is changed to the fourth etching condition without removing the mask formed of the resist. The fourth etching condition uses $CF_4$, $Cl_2$ and $O_2$ as the etching gases, and their gas flow rate ratio is set to 20/20/20 (sccm). 500 W RF (13.65 MHz) power is applied to the coil type electrode at a pressure of 1 Pa to generate plasma, and etching is carried out for about 20 seconds. 20 W RF (13.56 MHz) power is applied to the substrate side (sample stage) and a substantially negative self-bias voltage is applied. Here, the third and fourth etching conditions are called "second etching treatment". In this stage, the gate electrode 304 using the first conductor layer 304a as the lower layer and the second conductor layer 304b as the upper layer, and each electrode 305 to 307, are formed.

Next, after the mask of the resist is removed, first doping treatment for doping the entire surface with the gate electrodes 304 to 307 as the mask is carried out. An ion doping method or an ion injection method may be used for the first doping treatment. Ion doping is carried out under the doping condition of the dose of $1.5\times10^{14}$ atoms/cm$^2$ and an acceleration voltage of 60 to 100 keV. Phosphorus (P) or arsenic (As) is typically used as an impurity element that imparts an n type. First impurity regions (n$^{--}$ regions) 322 to 325 are formed in self-alignment.

Next, a mask is afresh formed of a resist. In this instance, the mask is formed in such a fashion as to cover a channel formation region, and its part, of a semiconductor layer for forming a switching TFT 403 of a pixel portion 401 in order to reduce an OFF current value of the switching TFT 403. The mask is disposed also to protect the channel formation region of a semiconductor layer for forming a p-channel TFT 406 of a driving circuit and its peripheral region. In addition, the mask is formed in such a fashion as to cover the channel formation region of a semiconductor layer for forming a current controlling TFT 404 of the pixel portion 401 and its peripheral region.

Next, the second doping treatment is selectively carried out by use of the mask of the resist to form an impurity region (n$^-$ region) as a part of the gate electrode. Ion doping or ion injection may be employed for the second doping treatment. This embodiment uses ion doping. A gas prepared by diluting phosphine ($PH_3$) by hydrogen to 5% is used at a flow rate of 30 sccm, at a dose of $1.5\times10^{14}$ atoms/cm$^2$ and at an acceleration voltage of 90 keV. In this case, both mask formed of the resist and second conductor layer together operate as a mask for the impurity element imparting the n type, and second impurity regions 311 and 312 are formed. An impurity element that imparts the n type is doped to the second impurity region in a concentration range of $1\times10^{16}$ to $1\times10^{17}$/cm$^3$. Here, the region having the same concentration range as that of the second impurity region is called also the "n$^-$ region".

Next, the third doping treatment is carried out without removing the mask of the resist. Ion doping or ion injection may be employed for the third doping treatment. The impurity element that imparts the n type is typically phosphorus (P) or arsenic (As). This embodiment uses ion doping. A gas prepared by diluting phosphine ($PH_3$) by hydrogen to 5% is used at a flow rate of 40 sccm, at a dose of $2\times10^{15}$ atoms/cm$^2$ and at an acceleration voltage of 80 keV. In this case, both mask formed of the resist and first and second conductor layers together operate as a mask for the impurity element imparting the n type, and third impurity regions 313, 314 and 326 to 328 are formed. An impurity element that imparts the n type is doped to the third impurity region in a concentration range of $1\times10^{20}$ to $1\times10^{21}$/cm$^3$. Here, the region having the same concentration range as that of the third impurity region is called also the "n$^+$ region".

After the mask formed of the resist is removed, a mask is afresh formed of a resist and the fourth doping treatment is carried out. The fourth doping treatment forms fourth impurity regions 318, 319, 332 and 333 and fifth impurity regions 316, 317, 330 and 331 in which the impurity element for imparting the p conductivity type is doped to the semiconductor layer forming the semiconductor layer of the p-channel TFT.

The impurity element imparting the p type is doped to the fourth impurity regions 318, 319, 332 and 333 within a concentration range of $1\times10^{20}$ to $1\times10^{21}$/cm$^3$. The fourth impurity regions 318, 319, 332 and 333 are the regions (n$^{--}$ regions) to which phosphorus (P) is doped in the preceding step, but since the impurity element imparting the p type is doped in a concentration 1.5 to 3 times the former, they have the p conductivity type. Here, the regions having the same concentration range as that of the fourth impurity regions are called also a "p$^+$ regions".

The fifth impurity regions 316, 317, 330 and 331 are formed in regions overlapping with the taper portion of the second conductor layer, and are doped with an impurity element that imparts the p type in a concentration range of $1\times10^{18}$ to $1\times10^{20}$/cm$^3$. Here, regions having the same concentration range as the fifth impurity regions are called also the "p$^-$ regions".

The process steps described above form the impurity regions having the n or p conductivity type in the respective semiconductor layer. Conductor layers 304 to 307 operate as the gate electrodes of TFT.

Next, an insulating film (not shown) is formed in such a fashion as to cover substantially the entire surface. This embodiment forms a silicon oxide film having a film thickness of 50 nm by use of plasma CVD. Needless to say, the insulating film is not particularly limited to the silicon oxide film, and a single or multi-layered structure of other silicon-containing insulating films may be used, too.

Next, an activation step of activating the impurity elements doped to the respective semiconductor layers is carried out. This activation step uses rapid thermal annealing (RTA) using a lamp light source, laser irradiation, heat-treatment using a furnace, or their combination. When activation treatment is carried out by irradiating the laser beam, the irradiation method of the laser beam and its scanning method may use the laser irradiation apparatus and the irradiation method described in any of Embodiment Modes 1 to 3 and Embodiment 1 to irradiate the laser beam to the semiconductor film.

In this embodiment, the insulating film is formed prior to the activation step, but may be formed after activation is carried out.

Next, a first inter-level insulating layer 308 of a silicon nitride film is formed and is heat-treated (at 300 to 550° C. for 1 to 12 hours) to hydrogenate the semiconductor layer. This step is the one that terminates a dangling bond of the semiconductor layer by means of hydrogen contained in the first inter-level insulating layer 308. The semiconductor layer can be hydrogenated irrespective of the existence/absence of an insulating film (not shown) of a silicon oxide film. Plasma hydrogenation (using hydrogen excited by plasma) may be employed as another means for hydrogenation.

Next, a second inter-level insulating film 309 made of an organic insulating material is formed on the first inter-level insulating film 308. In this embodiment, an acrylic resin film 309a having a film thickness of 1.6 µm is formed by using a coating method and a 200 nm-thick silicon nitride film 309b is sputtered and stacked.

Next, each pixel electrode 334 is formed in touch with the drain region of a current controlling TFT 404 of a p-channel TFT and in touch with a connection electrode that is to be later formed. In this embodiment, the pixel electrode is allowed to operate as an anode of OLED and is a transparent conductor film to transmit emitted light of OLED to the pixel electrode.

Contact holes reaching the conductor layer to operate as a gate electrode or a gate wiring and contact holes reaching each impurity region are then formed. This embodiment serially carries out a plurality of etching treatments. After the third inter-level insulating film is etched with the second inter-level insulating film in this embodiment, the second inter-level insulating film is etched with the first inter-level insulating film as the etching stopper and the first inter-level insulating film is thereafter etched.

Electrodes 335 to 341 or more concretely, source wiring, power supply lines, lead-out electrodes and connection electrodes, are formed of Al, Ti, Mo or W. This embodiment uses a stacked film of a Ti film (thickness: 100 nm), a silicon-containing Al film (thickness: 350 nm) and a Ti film (thickness: 50 nm) as the materials of these electrodes and wiring, and patterns the stacked film. The source electrode and the source wiring, the connection electrode, the lead-out electrode and the power supply line are suitably formed in this way. Incidentally, the lead-out electrode for establishing the contact with the gate wiring covered with the inter-level insulating film is disposed at the end portion of the gate wiring. An input/output terminal portion having a plurality of electrodes for the connection with external circuits and external electrodes is also formed at the end portion of each wiring. The connection electrode 341 that is so formed as to superpose with the pixel electrode 334 previously formed while keeping touch with the latter keeps contact with the drain region of the current controlling TFT 404.

In the way described above, it is possible to fabricate the n-channel TFT 405, the p-channel TFT 406, the driving circuit 402 having a CMOS circuit comprising the complementary combination of these TFT, and the pixel portion 401 having a plurality of n-channel TFT 403 or p-channel TFT 404 inside one pixel.

After patterning of each electrode is complete, the resist is removed and heat-treatment is carried out. Next, insulators 342a and 342b called "banks" are formed at both ends of the pixel electrode 334 in such a fashion as to cover both end portions. The banks 342a and 342b may be formed of a silicon-containing insulating film or a resin film. In this embodiment, an insulating film formed of an organic resin film is patterned to form the bank 342a, and a silicon nitride film is then formed by sputtering and is patterned to form the bank 342b.

Next, an EL layer 343 and a cathode 344 of OLED are formed on the pixel electrode 334 both ends of which are covered with the banks.

To form the EL layer 343, a light-emitting layer and a charge transportation layer or a charge injection layer may be freely combined to give an EL layer (a layer for light emission and for moving carriers for light emission). An polymeric EL material or an polymeric EL material may be used, for example. The EL layer can also use a thin film made of a light emitting material that emits light (fluorescence) by singlet excitation (singlet compound) or a thin film made of a light-emitting material that emits light (phosphorescence) by triplet excitation (triplet compound). Organic materials such as silicon carbide can be used for the charge transportation layer or the charge injection layer. Known materials can be used for these organic EL materials and inorganic materials.

It is believed desirable to use a metal having a small work function (typically a metal element belonging to the Group I or II of the Periodic Table) or an alloy containing such a metal element for the material of the cathode 344. The smaller the work function, the higher becomes light-emitting efficiency. Therefore, an alloy material containing lithium (Li) among the alkali metals is preferred as the material for the cathode. Incidentally, the cathode functions also as a common wiring of all the pixels, and has a terminal electrode at the input terminal portion through a connection wire.

Figure 6:
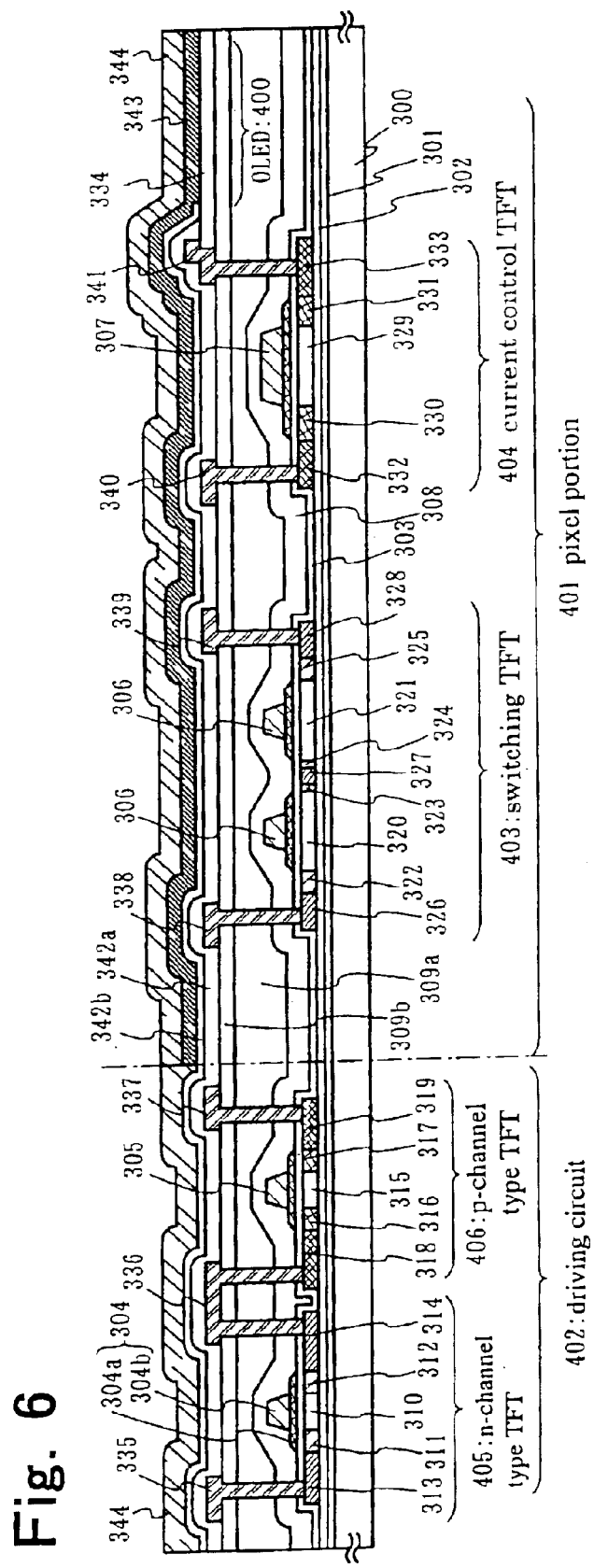
FIG. 6 shows a section (Embodiment 2)

FIG. 6 shows the state in which the process steps described above are completed. Though FIG. 6 shows the switching TFT 403 and TFT for supplying a current to OLED (current controlling TFT 404), it is of course possible to arrange various circuits formed of a plurality of TFT on the downstream side of the gate electrode of the current controlling TFT and the construction is in no way restrictive.

Next, the cathode, the organic compound layer and OLED having at least the anode are sealed by use of an organic resin, a protective film, a sealing substrate or a sealing can to completely cut off OLED from the outside and to prevent invasion of external moisture and oxygen that may otherwise promote degradation of the EL layer by oxidation. However, the protective film need not be provided to the input/output terminal that has to be connected later to FPC.

FPC (flexible printed circuit) is then bonded to each electrode of the input/output terminal by use of an anisotropic conductor material. The anisotropic conductor material includes a resin and conductor particles that have diameters of dozens to hundreds of microns and are applied to the surface by Au plating. The conductor particles electrically connect each electrode of the input/output terminal to the wiring formed on the FPC.

An optical film such as a circular polarization plate including a polarization plate and a phase difference plate may be disposed, whenever necessary, and an IC chip may be mounted, as well.

After the process steps described above are completed, a module type light-emitting apparatus having FPC connected thereto is completed.

This embodiment can be freely combined with any one of Embodiment Modes 1to 3 and Embodiment 1.

[Embodiment 3]

A top view of the module type light-emitting apparatus (called also "EL module") obtained by Embodiment 2 and its sectional view are shown.

Figure 7A:
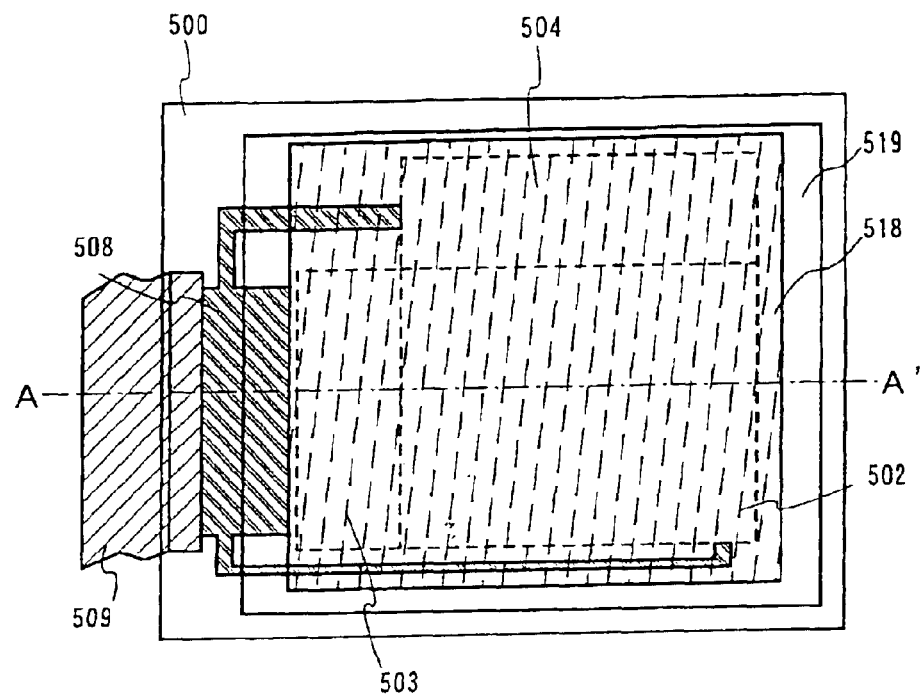
FIG. 7A and FIG. 7B show a module (Embodiment 3)
Figure 7B:
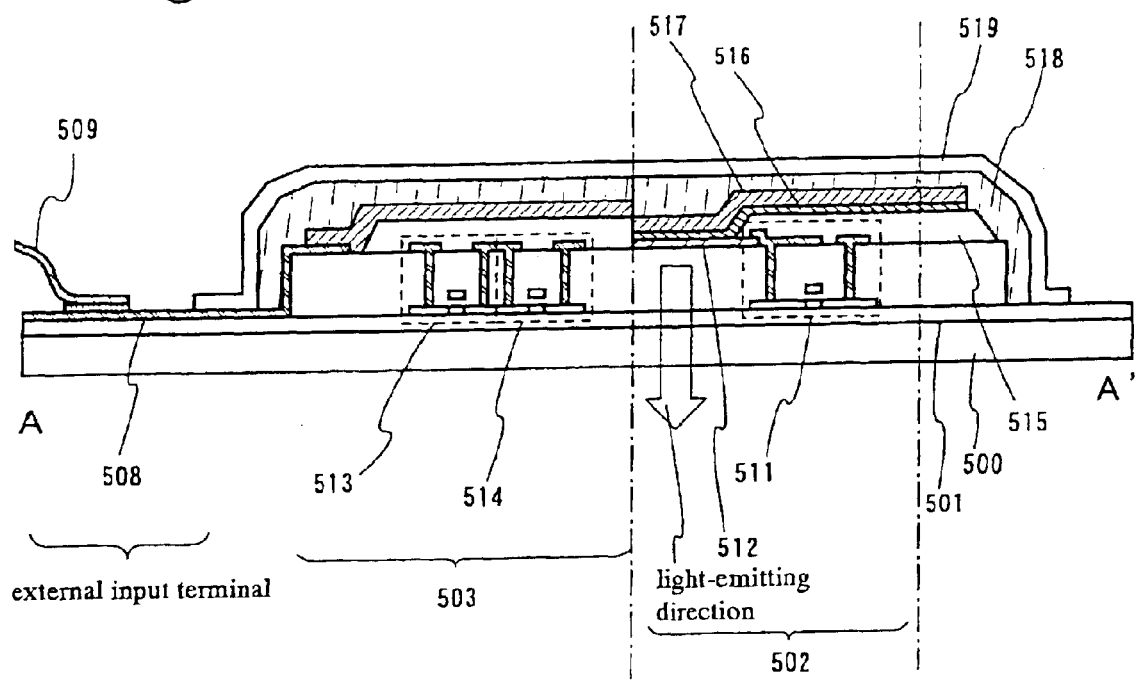

FIG. 7A is a top view showing the EL module and FIG. 7B is a sectional view taken along a line A—A' in FIG. 7A. Referring to FIG. 7A, a foundation insulating film 501 is formed on a substrate 500 (heat-resistant glass, for example), and a pixel portion 502, a source side driving circuit 504 and a gate side driving circuit 503 are formed on and over the insulating film 501. These pixel portion and driving circuits can be fabricated in accordance with Embodiment 2 described above.

Reference numeral 518 denotes an organic resin. Reference numeral 519 denotes a protective film. An organic resin 518 covers the pixel portion and the driving circuit portions, and the protective film 519 covers this organic resin. A cover material may further be used for sealing by use of an adhesive. A sealing resin or a sealing can is used for the cover material. Inert gas or silicone oil may be sealed into gaps between the EL layer and the cover material.

Reference numeral 508 denotes a cable for transferring a signal to be inputted to the source driving circuit 504 and to the gate side driving circuit 503. It receives a video signal and a clock signal from FPC (Flexible Printed Circuit) 509 as the external input terminal. Though the drawing shows only the FPC, a printed wiring board (PWB) may be fitted to this FPC. The light-emitting apparatus in this specification includes not only the light-emitting apparatus main body but also the light-emitting apparatus to which the FPC or the PWB is mounted.

Next, the sectional structure will be explained with reference to FIG. 7B. The foundation insulating film 501 is disposed on the substrate 500, and the pixel portion 502 and the gate side driving circuit 503 are formed on and over the insulating film 501. The pixel portion 502 includes a plurality of pixels including current controlling TFT 511 and the pixel electrode 512 electrically connected to the drain of this TFT 511. The gate side driving circuit 503 uses the CMOS circuit comprising the combination of the n-channel TFT 513 and the p-channel TFT 514.

These TFT (including 511, 513 and 514) may be fabricated in the same way as the n-channel TFT in Embodiment 2 and the p-channel TFT in Embodiment 2. FIG. 7B shows only the TFT (current controlling TFT 511) for supplying the current to the OLED. However, various circuits including a plurality of TFT may be disposed on the downstream side of the gate electrode of this TFT, and the circuit construction is not particularly restrictive.

The pixel portion 502, the source side driving circuit 504 and the gate side driving circuit 503 are formed on the same substrate in the same way as in Embodiment 2.

The pixel electrode 512 operates as the cathode of the light-emitting device (OLED). The banks 515 are formed at both ends of the pixel electrode 512, and the organic compound layer 516 and the cathod 517 of the light-emitting device are formed on the pixel electrode 512.

The organic compound layer 516 (layer for emitting light and for moving the carriers for light emission) may be formed by freely combining the light-emitting layer and the charge transportation layer or the charge injection layer. It is possible to use a low molecular weight organic compound and a polymeric compound, for example. A thin film formed of a light-emitting material (singlet compound) that emits light (fluorescence) by singlet excitation or a light-emitting material (triplet compound) that emits light (phosphorescence) by triplet excitation can be used for the organic compound layer 516. Inorganic materials such as silicon carbide can be used for the charge transportation layer and the charge injection layer. Known materials can be used for these organic and inorganic materials.

The cathod 517 operates as a common wire for all the pixels and is electrically connected to the EPC 509 through a connection wire 508. All the devices contained in the pixel portion 502 and in the gate side driving circuit 503 are covered with the cathode 517, the organic resin 518 and the protective film 519.

The organic resin 518 is preferably those which are transparent or translucent as much as possible to the visible light. The organic resin 518 is preferably those which do not transmit the moisture and oxygen as much as possible.

After the organic resin 518 completely covers the light-emitting device, at least the protective film 519 is preferably disposed on the surface (exposed surface) of the organic resin 518 as shown in FIG. 7A and FIG. 7B. The protective film may be disposed on the entire surface of the substrate 500 including the back surface. Here, caution must be paid lest the protective film is formed at the portion where the external input terminal (FPC) is disposed. A mask may be used to prevent the formation of the protective film, or a tape such as Teflon® used as the masking tape in a CVD apparatus may be used to cover the external input terminal to prevent the formation of the protective film. The protective film 519 may use a silicon nitride film, a DLC film or an $AlN_xO_y$ film.

When the protective film 519 seals the light-emitting device by the construction described above, the light-emitting device can be completely cut off from the outside, and invasion of materials such as moisture and oxygen, that promote degradation of the organic compound layer due to oxidation, from outside can be prevented. A light-emitting apparatus having high reliability can thus be obtained.

It is further possible to use the pixel electrode as the anode and to stack the organic compound layer and the cathode so as to emit light in the opposite direction to FIG. 7B. FIG. 8 depicts an example. The top view is omitted because it is the same.

The sectional structure shown in FIG. 8 will be explained. The insulating film 610 is formed on the substrate 600. The pixel portion 602 and the gate side driving circuit 603 are formed over the insulating film 610. The pixel portion 602 includes a plurality of pixels including the current controlling TFT 611 and the pixel electrode 612 electrically connected to the drain of this TFT 611. The gate side driving circuit 603 is constituted by use of the CMOS circuit comprising the combination of the n-channel TFT 613 and the p-channel TFT 614.

These TFT (including 611, 613 and 614) may be fabricated in the same way as the n-channel TFT in Embodiment 2 and the p-channel TFT in Embodiment 2. FIG. 8 depicts only the TFT (current controlling TFT 611) for supplying the current to the OLED. However, various circuits including a plurality of TFT may be disposed on the downstream side of the gate electrode of this TFT, and the circuit construction is not of course restrictive, in particular.

The pixel electrode 612 operates as the cathode of the light-emitting device (OLED). The banks 615 are formed at both ends of the pixel electrode 612, and the organic compound layer 616 and the anode 617 of the light-emitting device are formed on the pixel electrode 612.

The anode 617 operates as a common wire for all the pixels and is electrically connected to the EPC 609 through a connection wire 608. All the devices contained in the pixel portion 602 and in the gate side driving circuit 603 are covered with the anode 617, the organic resin 618 and the protective film 619. A cover material 620 may be bonded through an adhesive. A recess may be formed in the cover material 620 and a desiccating agent 621 may be put into the recess.

Since the pixel electrode is the cathode and the organic compound layer and the anode are stacked in FIG. 8, the light emitting direction is the direction indicated by arrow in FIG. 8.

Though the explanation is hereby given on the top gate TFT by way of example, the invention can be applied irrespective of the TFT structure. For example, the invention can be applied to a bottom gate type (inverse stagger type) TFT and a forward stagger type TFT.

This embodiment can be freely combined with any of Embodiment Modes 1 to 3 and Embodiments 1 and 2.

[Embodiment 4]

Figure 9:
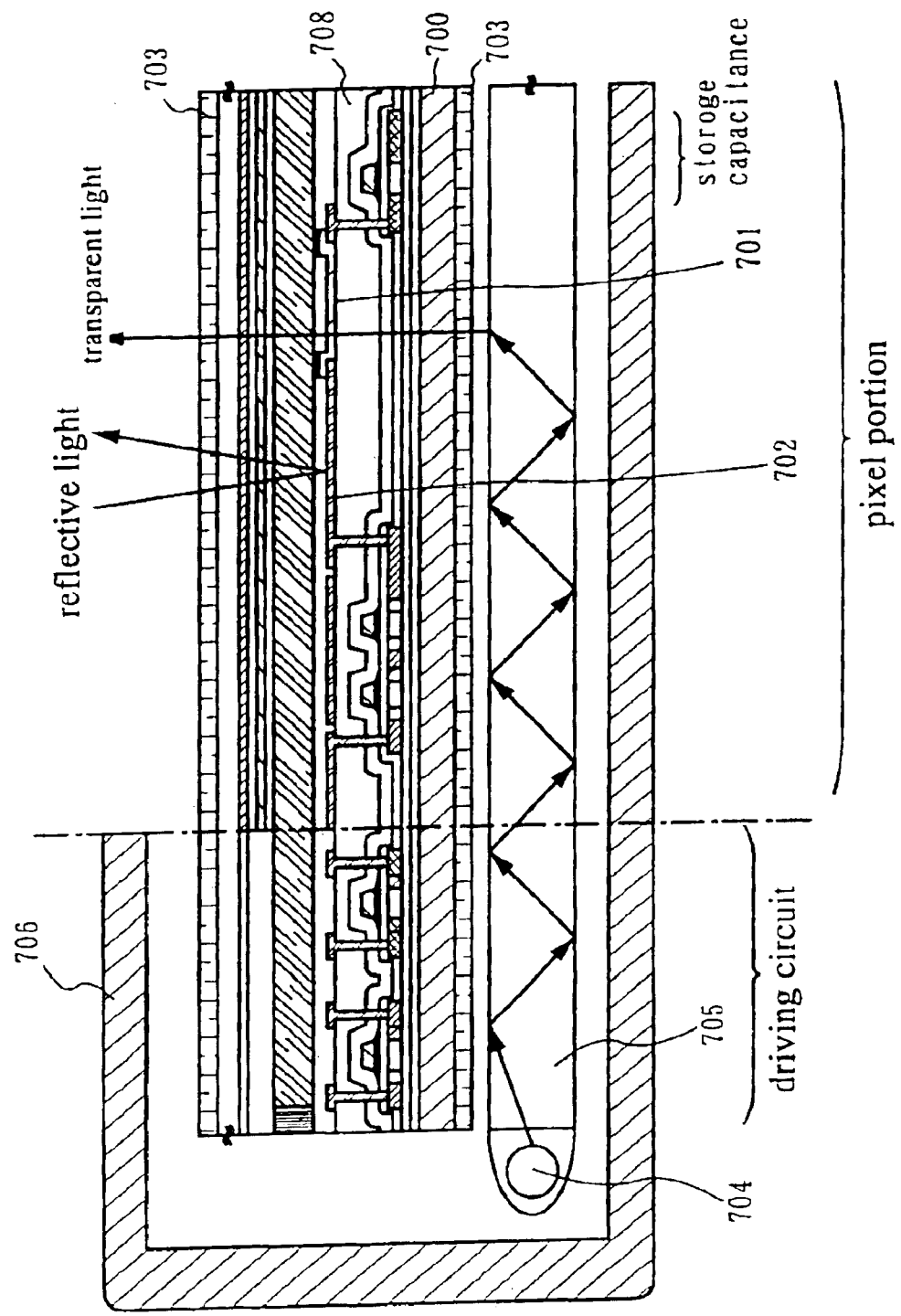
FIG. 9 shows a sectional view of a liquid crystal display device (Embodiment 4)

FIG. 9 shows an example of a translucent type liquid crystal display device in which pixel electrodes are formed of both conductor film having transmissibility and a metal material having reflection property.

In this liquid crystal display device, too, n-channel TFT as a pixel TFT can be fabricated in accordance with Embodiment 2. The process steps up to the formation step of the inter-level insulating film 708 covering the TFT are the same as those in Embodiment 2, and the detailed explanation will be omitted. One of the electrodes in the pixel portion coming into contact with the source or drain region of the TFT is formed of the metal material having the reflection property to form the pixel electrode (reflection portion) 702. Next, a pixel electrode (transmission portion) 701 of the conductor film having transmissibility is formed in such a fashion as to partially overlap with the pixel electrode (reflection portion) 702. ITO (indium oxide-tin oxide alloy), indium oxide-zinc oxide alloy ($In_2O_3$—ZnO) or zinc oxide (ZnO) can be used for the conductor film having transmissibility.

The pixel TFT can be formed on the substrate 700 after the process steps described above are completed.

Next, an orientation film is formed and rubbing treatment is carried out. In this embodiment, a columnar spacer (not shown) is formed at a desired position by patterning an organic resin film such as an acrylic resin film to keep a substrate gap. Spherical spacers may be sprayed over the entire substrate surface in place of the columnar spacer.

An opposing substrate as a support is then prepared. Color filters (not shown) having a coloring layer and a shading layer so arranged as to correspond to each pixel is arranged on this opposing substrate. The shading layer is also disposed at the driving circuit portion, too. A planarization film (not shown) covering the color filter and the shading layer is then disposed. Opposing electrodes formed of a transparent conductor film are formed on the planarization film in the pixel portion. An orientation film is formed on the entire surface of the opposing substrate and is subjected to rubbing treatment.

The substrate 700 having the pixel portion and the driving circuit formed thereon is bonded to the opposing substrate through a sealant. The sealant contains filler, and the two substrates are bonded while the filler and the columnar spacer keep a uniform gap between them. A liquid crystal material is filled between both substrates and is completely sealed through a sealing material (not shown). A known liquid crystal material may be used for the liquid crystal material. A backlight 704 and a light guide plate 705 are provided to the liquid crystal module so obtained and a cover 706 is put, thereby completing an active matrix type liquid crystal display device a part of which is shown in the sectional view of FIG. 9. The cover is bonded to the liquid crystal module through an adhesive or an organic resin. When the plastic substrate is bonded to the opposing substrate, the organic resin may be filled between a frame and the substrates while the frame encompasses the substrates. A polarization sheet 703 is bonded to both substrate 700 and opposing substrate because it is of a translucent type.

When external light sufficiently exists, display is conducted while the liquid crystal between the opposing electrodes of the opposing substrate and the pixel electrodes (reflection portion) 702 is controlled and while the backlight is kept OFF so as to let the liquid crystal module operate as a reflection type module. When external light is not sufficient, display is conducted while the liquid crystal between the opposing electrodes of the opposing substrate and the pixel electrodes (transmission portion) 701 is controlled and while the backlight is kept ON.

When the liquid crystal used is a TN liquid crystal or an STN liquid crystal, however, a twist angle is different between the reflection type and the transmission type, and the polarization plate and the phase difference plate must be optimized. For example, a polarization compensation mechanism (such as a polarization plate using a polymer liquid crystal) for adjusting the twist angle of the liquid crystal becomes separately necessary.

This embodiment represents an example of the translucent type liquid crystal display device. However, a transmission type liquid crystal display device can be fabricated when all the pixel electrodes are formed of a transparent conductor film. Needless to say, a reflection type liquid crystal display device can be fabricated when the pixel electrodes are formed of a conductor film having high reflection property.

This embodiment can be freely combined with any of Embodiment Modes 1 to 3 and Embodiment 1.

[Embodiment 5]

The driving circuit and the pixel portion fabricated in the invention can be used for various modules (active matrix type liquid crystal module, active matrix type EL module, active matrix type EC module). In other words, when the invention is executed, all electronic appliances having the module built therein can be completed.

Examples of such electronic appliances include a video camera, a digital camera, a head-mount display (goggle type display), a car navigation unit, a projector, a car stereo unit, a personal computer, a mobile information terminal (mobile computer, cellular telephone, electronic book). FIGS. 10 to 12 depict examples of such appliances.

Figure 10A:
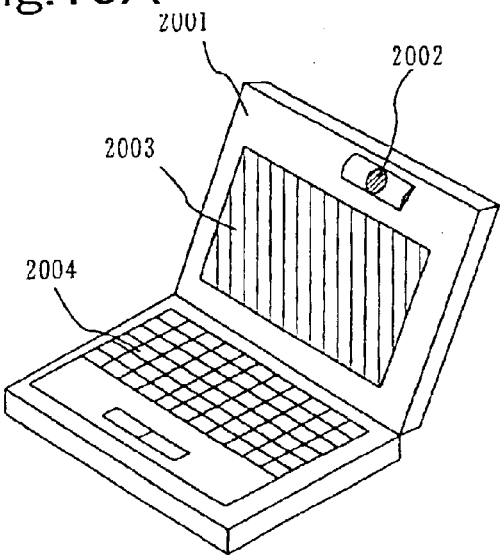
FIGS. 10A–F show an electronic appliance (Embodiment 5)

FIG. 10A depicts a personal computer. The personal computer includes a main body 2001, an image input unit 2002, a display unit 2003 and a keyboard 2004.

Figure 10B:
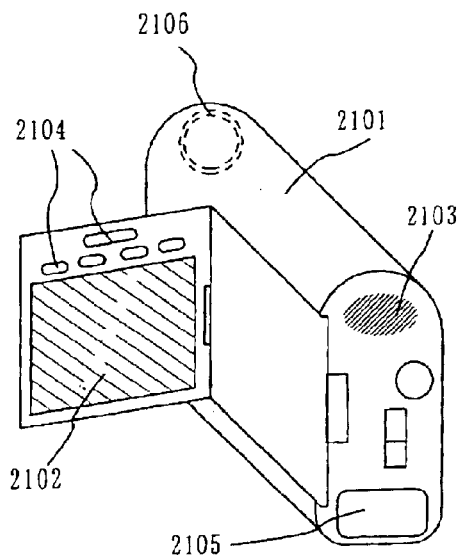

FIG. 10B depicts a video camera. The video camera includes a main body 2101, a display unit 2102, a speech input unit 2103, an operation switch 2104, a battery 2105 and an image reception unit 2106.

Figure 10C:
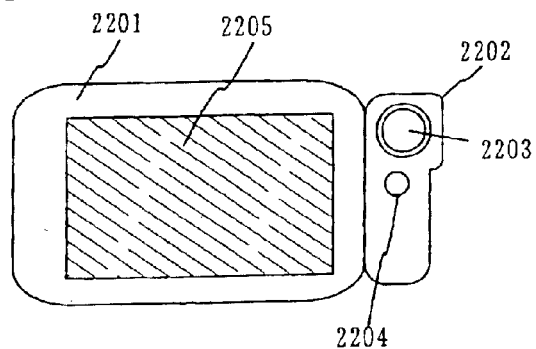

FIG. 10C depicts a mobile computer. The mobile computer includes a main body 2201, a camera unit 2202, an image reception unit 2203, an operation switch 2204 and a display unit 2205.

Figure 10D:
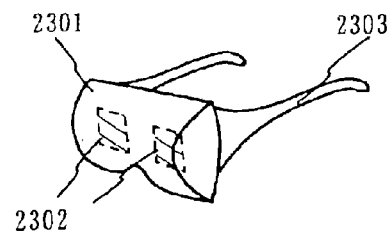

FIG. 10D depicts a goggle type display. The goggle type display includes a main body 2301, a display unit 2302 and an arm unit 2303.

Figure 10E:
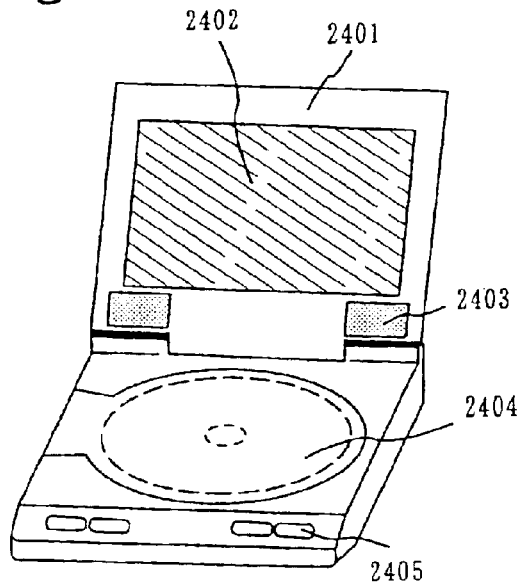

FIG. 10E depicts a player using a recording medium that records a program (hereinafter called "recording medium").

The player includes a main body 2401, a display unit 2402, a speaker unit 2403, a recording medium 2404 and an operation switch 2405. This player uses DVD (Digital Versatile Disc) or CD as the recording medium and can enjoy music, pictures, games and Internet.

Figure 10F:
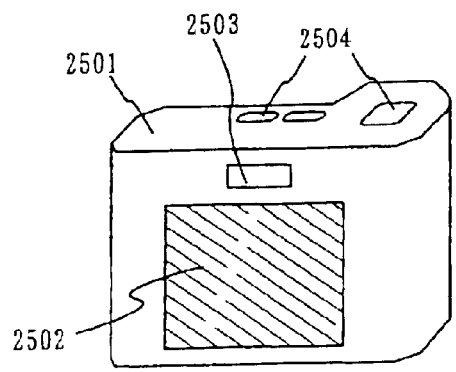

FIG. 10F depicts a digital camera. The digital camera includes a main body 2501, a display unit 2502, an eyepiece unit 2503, an operation switch 2504 and an image reception unit (not shown).

Figure 11A:
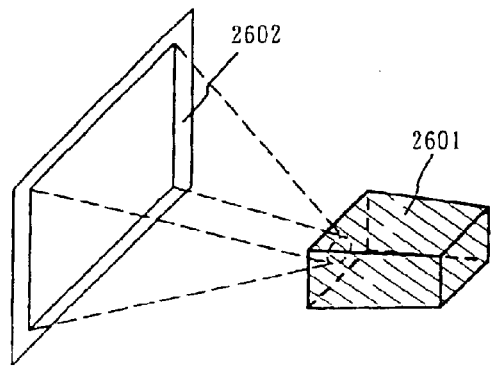
FIGS. 11A–D show an electronic appliance (Embodiment 5)

FIG. 11A depicts a front type projector. The front type projector includes a projection apparatus 2601 and a screen 2602. The overall system can be completed when the invention is applied to the liquid crystal module 2808 constituting a part of the projection apparatus 2601.

Figure 11B:
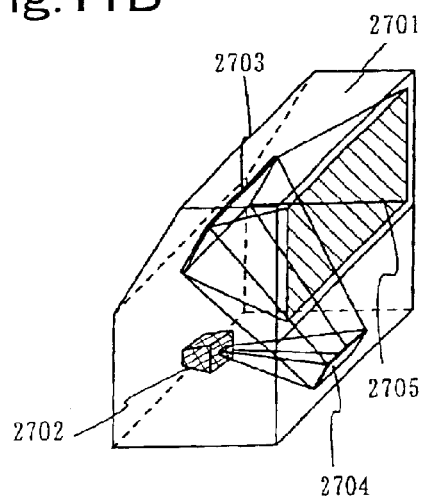

FIG. 11B depicts a rear type projector. The rear type projector includes a main body 2701, a projection apparatus 2702, a mirror 2703 and a screen 2704. The overall system can be completed when the invention is applied to the liquid crystal module 2808 constituting a part of the projection apparatus 2702.

Figure 11C:
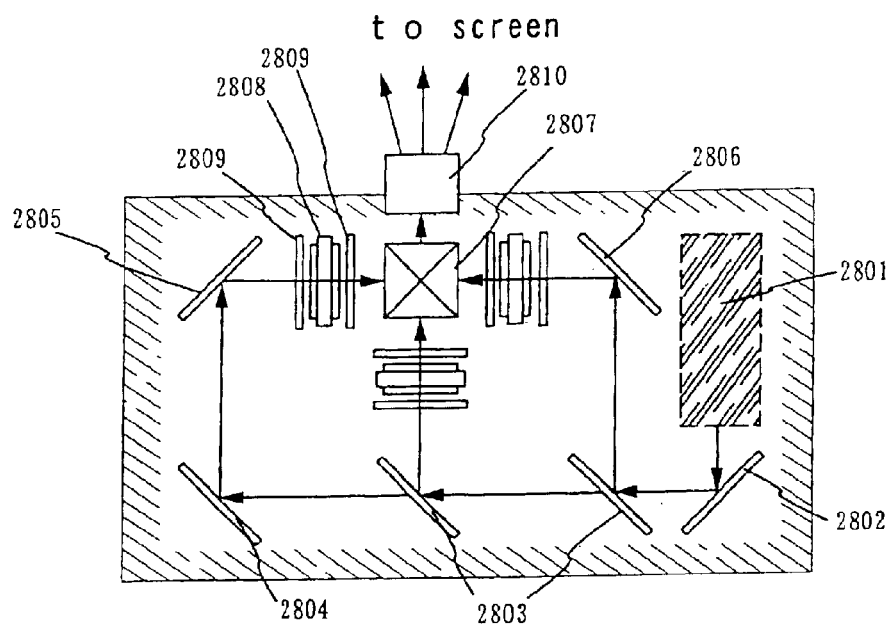

FIG. 11C shows an example of the construction of the projection apparatuses 2601 and 2702 in FIGS. 11A and 11B. Each projection apparatus 2601 and 2702 includes a light source optical system 2801, mirrors 2802, 2804 to 2806, a dichroic mirror 2803, a prism 2807, a liquid crystal module 2808, a phase difference plate 2809 and a projection optical system 2810. The projection optical system 2810 includes an optical system including a projection lens. Though this embodiment represents an example of a three-plate type, the construction is not particularly limited thereto but may be of a single-plate type. An operator may appropriately insert an optical system such as an optical lens, a film having a polarization function, a film for adjusting the phase difference or an IR film into an optical path indicated by arrow in FIG. 11C.

Figure 11D:
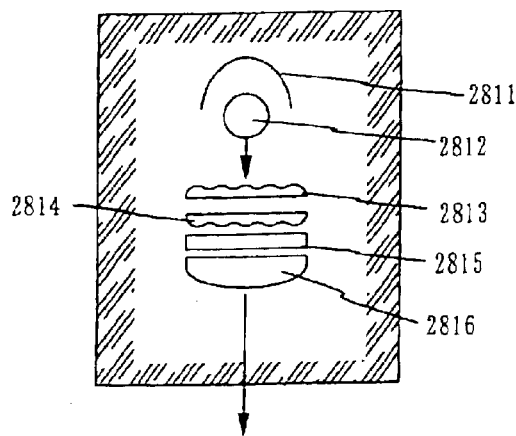

FIG. 11D shows an example of the construction of the light source optical system 2801 in FIG. 11C. The light source optical system 2801 in this embodiment includes a reflector 2811, a light source 2812, lens arrays 2813 and 2814, a polarization conversion device 2815 and a condensing lens 2816. The light source optical system shown in FIG. 11D is merely an example and is in no way restrictive. For examples, an operator may appropriately insert an optical system such as an optical lens, a film having a polarization function, a film for adjusting the phase difference or an IR film into light source optical system shown in FIG. 11D.

However, the projector shown in FIGS. 11A–D represents the case where a transmission type electro-optical apparatus is used, and an application example to a reflection type electro-optical apparatus and an EL module is not shown.

Figure 12A:
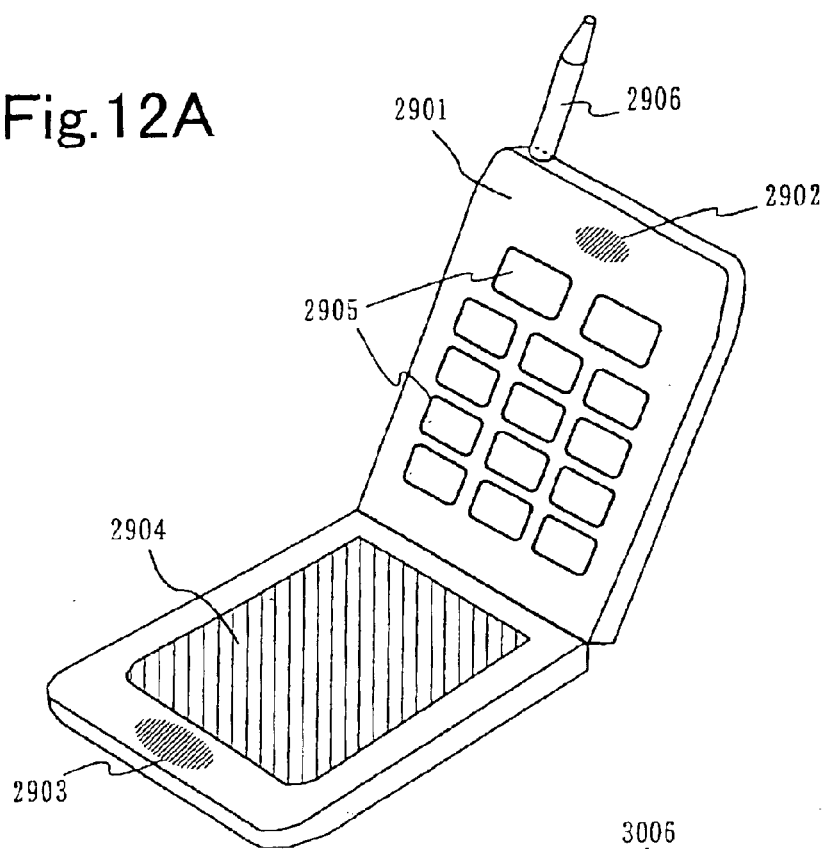
FIGS. 12A–C show an electronic appliance (Embodiment 5)

FIG. 12A depicts a cellular telephone unit. The cellular telephone unit includes a main body 2901, a speech output unit 2902, a speech input unit 2903, a display unit 2904, an operation switch 2905, an antenna 2906 and an image input unit (CCD or image sensor) 2907.

Figure 12B:
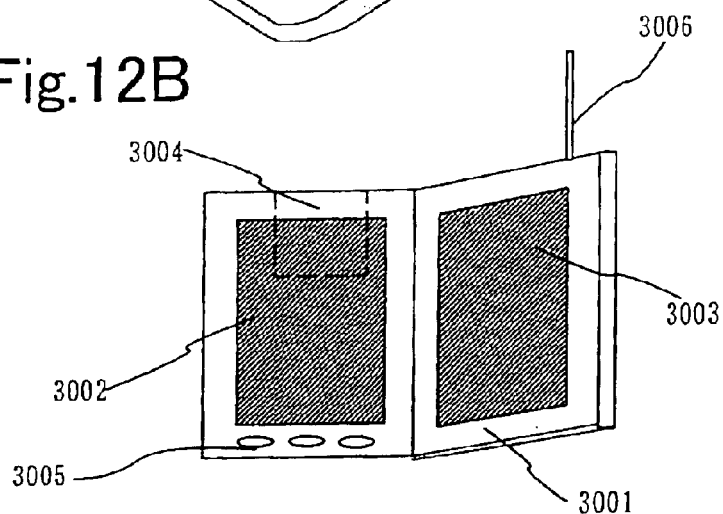

FIG. 12B depicts a portable book (electronic book). The portable book includes a main body 3001, display units 3002 and 3003, a recording medium 3004, an operation switch 3005 and an antenna 3006.

Figure 12C:
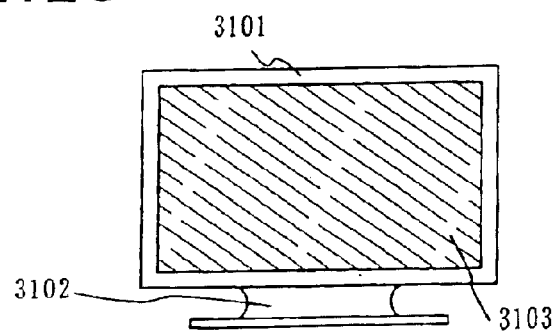

FIG. 12C depicts a display. The display includes a main body 3101, a support table 3102 and a display unit 3103.

Incidentally, the display shown in FIG. 12C includes displays of a small size, a medium size and a large size such as screen sizes of 5 to 20 inches. To produce a display unit of such sizes, it is preferred to use a substrate having a side of 1 m and to mass-produce them by conducting multiple chamfering.

As described above, the range of application of the invention is extremely broad, and the invention can be applied to production methods of electronic appliances of all industrial fields. The electronic appliances of this embodiment can be accomplished by using the construction comprising any combination of Embodiment Modes 1 to 3 and Embodiments 1 to 4.

The invention can limit the increase of the size of the laser irradiation apparatus even when the size of the substrate becomes great, can keep the angle of incidence of the laser beam to the irradiated surface constant and can conduct uniform laser annealing.

According to the invention, the energy density of the laser beam remains always constant on the surface of the semiconductor film even when the position of the laser beam moves on the substrate. Therefore, it is not necessary to interpose an f-θ lens for adjusting the energy density into the optical path between the laser beam source and the substrate, and the increase of the cost of the optical system and aberration due to the f-θ lens can be suppressed.

What is claimed is:

1. A laser irradiation apparatus comprising:

a laser;

means for moving an irradiation position of a laser beam on an irradiated surface by changing a traveling direction of the laser beam oscillated from said laser; and means for controlling an angle of incidence of the laser beam to said irradiated surface to a constant angle on the basis of said means for moving.

2. A laser irradiation apparatus as defined in a claim 1, wherein said laser is solid laser of continuous oscillation or solid laser of pulse oscillation.

3. A laser irradiation apparatus as defined in a claim 1, wherein said laser is one of a CW laser and a pulse oscillation laser, and said laser is one or more kinds of members selected from the group consisting of YAG laser, $YVO_4$ laser, YLF laser, $YAlO_3$ laser, $Y_2O_3$ laser, glass laser, ruby laser, alexandrite laser and Ti: sapphire laser.

4. A laser irradiation apparatus as defined in a claim 1, wherein said laser is one of a CW laser and a pulse oscillation laser, and said laser is one or more kinds of members selected from the group consisting of excimer laser, Ar laser and Kr laser.

5. A laser irradiation apparatus as defined in a claim 1, wherein the angle θ of incidence is an angle satisfying the relation $\theta \geq \arctan(w/(2 \times d))$ with respect to said irradiated surface.

6. A laser irradiation apparatus comprising:

a laser;

a mirror for moving an irradiation position of a laser beam on an irradiated surface by changing a traveling direction of the laser beam oscillated from said laser; and a stage for controlling an angle of incidence of the laser beam to said irradiated surface to a constant angle on the basis of said mirror for moving.

7. A laser irradiation apparatus as defined in a claim 6, wherein said stage includes means for fixing the irradiated object and means for changing the angle of the irradiated object to the horizontal plane.

8. A laser irradiation apparatus as defined in a claim 6, wherein said laser is solid laser of continuous oscillation or solid laser of pulse oscillation.

9. A laser irradiation apparatus as defined in a claim 6, wherein said laser is one of a CW laser and a pulse oscillation laser, and said laser is one or more kinds of members selected from the group consisting of YAG laser, YVO$_4$ laser, YLF laser, YAlO$_3$ laser, Y$_2$O$_3$ laser, glass laser, ruby laser, alexandrite laser and Ti: sapphire laser.

10. A laser irradiation apparatus as defined in claim 6, wherein said laser is one of a CW laser and a pulse oscillation laser, and said laser is one or more kinds of members selected from the group consisting of excimer laser, Ar laser and Kr laser.

11. A laser irradiation apparatus as defined in claim 6, wherein the angle θ of incidence is an angle satisfying the relation θ≧arctan(w/(2×d)) with respect to said irradiated surface.

12. A laser irradiation apparatus as defined in a claim 6, wherein said stage is a goniometer or a manipulator.

13. A laser irradiation apparatus comprising:
   a laser;
   means for converting a shape of a laser beam oscillated from said laser on an irradiated surface to an elliptic or rectangular shape;
   means for changing a traveling direction of the laser beam and moving an irradiation position of the laser beam on said irradiated surface in a first direction;
   means for controlling an angle between a horizontal plane and said irradiated surface and keeping an angle of incidence of the laser beam to said irradiated surface constant on the basis of said moving means; and
   means for moving a treated object having said irradiated surface, and moving the irradiation position of the laser beam on said irradiated surface in a second direction.

14. A laser irradiation apparatus as defined in a claim 13, wherein said first direction and said second direction cross each other on a plane.

15. A laser irradiation apparatus as defined in a claim 13, wherein said laser is solid laser of continuous oscillation or solid laser of pulse oscillation.

16. A laser irradiation apparatus as defined in a claim 13, wherein said laser is one of a CW laser and a pulse oscillation laser, and said laser is one or more kinds of members selected from the group consisting of YAG laser, YVO$_4$ laser, YLF laser, YAlO$_3$ laser, Y$_2$O$_3$ laser, glass laser, ruby laser, alexandrite laser and Ti: sapphire laser.

17. A laser irradiation apparatus as defined in a claim 13, wherein said laser is one of a CW laser and a pulse oscillation laser, and said laser is one or more kinds of members selected from the group consisting of excimer laser, Ar laser and Kr laser.

18. A laser irradiation apparatus as defined in a claim 13, wherein the angle θ of incidence is an angle satisfying the relation θ≧arctan(w/(2×d)) with respect to said irradiated surface.

19. A laser irradiation apparatus comprising:
   a laser;
   a cylindrical lens for converting a shape of a laser beam oscillated from said laser on an irradiated surface to an elliptic or rectangular shape;
   a convex lens for condensing the laser beam;
   a galvanomirror for moving an irradiation position of the laser beam in a first direction; and
   a stage for moving a treated object having said irradiated surface, and moving the irradiation position of the laser beam on said irradiated surface in a second direction;
   wherein said stage is controlled to an arbitrary angle with respect to a horizontal plane on the basis of an angle of said galvanomirror with respect to the laser beam and keeps an angle of incidence of the laser beam to said irradiated surface constant.

20. A laser irradiation apparatus as defined in a claim 19, wherein said first direction and said second direction cross each other on a plane.

21. A laser irradiation apparatus as defined in a claim 19, wherein said stage includes means for fixing said irradiated object and means for changing the angle of the irradiated object to the horizontal plane.

22. A laser irradiation apparatus as defined in a claim 19, wherein said laser is solid laser of continuous oscillation or solid laser of pulse oscillation.

23. A laser irradiation apparatus as defined in a claim 19, wherein said laser is one of a CW laser and a pulse oscillation laser, and said laser is one or more kinds of members selected from the group consisting of YAG laser, YVO$_4$ laser, YLF laser, YAlO$_3$ laser, Y$_2$O$_3$ laser, glass laser, ruby laser, alexandrite laser and Ti: sapphire laser.

24. A laser irradiation apparatus as defined in a claim 19, wherein said laser is one of a CW laser and a pulse oscillation laser, and said laser is one or more kinds of members selected from the group consisting of excimer laser, Ar laser and Kr laser.

25. A laser irradiation apparatus as defined in a claim 19, wherein the angle θ of incidence is an angle satisfying the relation θ≧arctan(w/(2×d)) with respect to said irradiated surface.

26. A laser irradiation apparatus as defined in a claim 19, wherein said stage is a goniometer or a manipulator.

27. A laser irradiation apparatus comprising:
   a laser;
   a cylindrical lens for converting a shape of a laser beam oscillated from said laser on an irradiated surface to an elliptic or rectangular shape;
   a convex lens for condensing the laser beam;
   a polygon mirror for moving an irradiation position of the laser beam in a first direction; and
   a stage for moving a treated object having said irradiated surface, and moving the irradiation position of the laser beam on said irradiated surface in a second direction;
   wherein said stage is controlled to an arbitrary angle with respect to a horizontal plane on the basis of an angle of said polygon mirror with respect to the laser beam and keeps an angle of incidence of the laser beam to said irradiated surface constant.

28. A laser irradiation apparatus as defined in a claim 27, wherein said first direction and said second direction cross each other on a plane.

29. A laser irradiation apparatus as defined in a claim 27, wherein said stage includes means for fixing the irradiated object and means for changing the angle of the irradiated object to the horizontal plane.

30. A laser irradiation apparatus as defined in a claim 27, wherein said laser is solid laser of continuous oscillation or solid laser of pulse oscillation.

31. A laser irradiation apparatus as defined in a claim 27, wherein said laser is one of a CW laser and a pulse oscillation laser, and said laser is one or more kinds of members selected from the group consisting of YAG laser, YVO$_4$ laser, YLF laser, YAlO$_3$ laser, Y$_2$O$_3$ laser, glass laser, ruby laser, alexandrite laser and Ti: sapphire laser.

32. A laser irradiation apparatus as defined in a claim 27, wherein said laser is one of a CW laser and a pulse oscillation laser, and said laser is one or more kinds of members selected from the group consisting of excimer laser, Ar laser and Kr laser.

33. A laser irradiation apparatus as defined in a claim 27, wherein the angle θ of incidence is an angle satisfying the relation θ≧arctan(w/(2×d)) with respect to said irradiated surface.

34. A laser irradiation apparatus as defined in a claim 27, wherein said stage is a goniometer or a manipulator.

35. A laser irradiation apparatus comprising:
   a laser;
   a cylindrical lens for converting a shape of a laser beam oscillated from said laser on an irradiated surface to an elliptic or rectangular shape;
   a convex lens for condensing the laser beam;
   a first galvanomirror for moving an irradiation position of the laser beam in a first direction; and
   a second galvanomirror for moving the irradiation position of the laser beam in a second direction;
   wherein said stage is controlled to an arbitrary angle with respect to a horizontal plane on the basis of an angle of said first or second galvanomirror with respect to the laser beam, and keeps an angle of incidence of the laser beam to said irradiated surface constant.

36. A laser irradiation apparatus as defined in a claim 35, wherein said first direction and said second direction cross each other on a plane.

37. A laser irradiation apparatus as defined in a claim 35, wherein said stage includes means for fixing the irradiated object and means for changing the angle of the irradiated object to the horizontal plane.

38. A laser irradiation apparatus as defined in a claim 35, wherein said laser is solid laser of continuous oscillation or solid laser of pulse oscillation.

39. A laser irradiation apparatus as defined in a claim 35, wherein said laser is one of a CW laser and a pulse oscillation laser, and said laser is one or more kinds of members selected from the group consisting of YAG laser, $YVO_4$ laser, YLF laser, $YAlO_3$ laser, $Y_2O_3$ laser, glass laser, ruby laser, alexandrite laser and Ti: sapphire laser.

40. A laser irradiation apparatus as defined in a claim 35, wherein said laser is one of a CW laser and a pulse oscillation laser, and said laser is one or more kinds of members selected from the group consisting of excimer laser, Ar laser and Kr laser.

41. A laser irradiation apparatus as defined in a claim 35, wherein the angle θ of incidence is an angle satisfying the relation $θ \geq \arctan(w/(2 \times d))$ with respect to said irradiated surface.

42. A laser irradiation apparatus as defined in a claim 35, wherein said stage is a goniometer or a manipulator.

* * * * *